United States Patent
Okita et al.

(10) Patent No.: US 10,497,622 B2
(45) Date of Patent: Dec. 3, 2019

(54) ELEMENT CHIP MANUFACTURING METHOD

(71) Applicant: Panasonic Intellectual Property Management Co., Ltd., Osaka (JP)

(72) Inventors: Shogo Okita, Hyogo (JP); Mitsuru Hiroshima, Osaka (JP); Atsushi Harikai, Osaka (JP); Noriyuki Matsubara, Osaka (JP); Akihiro Itou, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/622,250

(22) Filed: Jun. 14, 2017

(65) Prior Publication Data
US 2018/0012802 A1 Jan. 11, 2018

(30) Foreign Application Priority Data
Jul. 7, 2016 (JP) .................. 2016-135232

(51) Int. Cl.
*H01L 21/67* (2006.01)
*H01L 21/78* (2006.01)
*H01L 21/3065* (2006.01)
*H01L 21/308* (2006.01)

(52) U.S. Cl.
CPC ............ *H01L 21/78* (2013.01); *H01L 21/308* (2013.01); *H01L 21/3065* (2013.01)

(58) Field of Classification Search
CPC ............ H01L 21/67092; H01L 21/6836; H01L 21/71
See application file for complete search history.

(56) References Cited

U.S. PATENT DOCUMENTS 5,928,818 A * 7/1999 Mertesdorf ............... C08F 8/00
430/18
2001/0003759 A1* 6/2001 Sato .................. C08G 59/1461
522/109

(Continued)

FOREIGN PATENT DOCUMENTS

JP   2002-093749 A   3/2002
JP   2005-191039 A   7/2005

(Continued)

*Primary Examiner* — Mohammad M Choudhry
(74) *Attorney, Agent, or Firm* — Pearne & Gordon LLP

(57) ABSTRACT

A semiconductor chip manufacturing method includes preparing a semiconductor wafer including a front surface on which a bump is exposed, a rear surface located at a side opposite to the front surface, a plurality of element regions in each of which the bump is formed, and a dividing region defining each of the element regions, forming a mask which covers the bump and has an opening exposing the dividing region on the surface of the semiconductor wafer by spraying liquid which contains raw material of the mask along the bump by a spray coating method, and singulating the semiconductor wafer by exposing the surface of the semiconductor wafer to first plasma and etching the dividing region, which is exposed to the opening, until the rear surface is reached in a state where the bump is covered by the mask.

8 Claims, 18 Drawing Sheets

(56) References Cited

U.S. PATENT DOCUMENTS

| | | | | |
|---|---|---|---|---|
| 2001/0055855 A1* | 12/2001 | Fischer | ............... | H01L 21/3043 438/460 |
| 2003/0190770 A1* | 10/2003 | Yeom | ....................... | C30B 29/20 438/113 |
| 2005/0238894 A1* | 10/2005 | Gorman | ................ | C04B 35/486 428/469 |
| 2007/0141330 A1* | 6/2007 | Morishima | ......... | H01L 21/6835 428/343 |
| 2009/0026291 A1* | 1/2009 | Shimada | ................ | B05B 7/066 239/405 |
| 2009/0121321 A1* | 5/2009 | Miccoli | ............... | G03F 7/70625 257/618 |
| 2009/0191474 A1* | 7/2009 | Sun | ....................... | G03F 7/0752 430/5 |
| 2011/0136321 A1* | 6/2011 | Kuroda | ............... | H01L 21/6835 438/459 |
| 2011/0159628 A1* | 6/2011 | Shin | ..................... | H01G 9/2068 438/62 |
| 2012/0292782 A1* | 11/2012 | Lee | ....................... | H01L 23/481 257/774 |
| 2015/0243920 A1* | 8/2015 | Edman | ................ | H01L 51/5016 257/13 |
| 2017/0033026 A1* | 2/2017 | Ho | .......................... | H01L 21/56 |

FOREIGN PATENT DOCUMENTS

| | | |
|---|---|---|
| JP | 2006-286763 A | 10/2006 |
| JP | 2012-124211 A | 6/2012 |
| JP | 2017-103330 A | 6/2017 |
| WO | 2015/031096 A1 | 3/2015 |

* cited by examiner

ELEMENT CHIP MANUFACTURING METHOD

BACKGROUND

1. Technical Field

The present disclosure is related to an element chip manufacturing method.

2. Description of the Related Art

As a method for singulating a substrate including a plurality of element regions defined by dividing regions, a method for singulating the substrate by plasma etching the dividing regions to a depth which extends from one face of the substrate to the other face (plasma dicing) is known. The substrate, in general, includes a semiconductor layer, a circuit layer laminated on the semiconductor layer, an electrode pad (bonding pad) disposed on the circuit layer, and a metal electrode such as a projection (bump) containing a metallic material such as a solder ball. An element chip including the circuit layer and the metal electrode is formed by plasma etching the dividing regions of the substrate.

The plasma dicing is performed by placing the substrate on a stage installed in a plasma processing device. Generally, the substrate is singulated in such a way that the semiconductor layer is placed on the stage to be opposed to the stage and plasma is irradiated from a face side (circuit layer) on which the electrode pad and the bump of the substrate are disposed (see Japanese Patent Unexamined Publication No. 2002-93749). This is because damage due to contact between the electrode pad or the stage of the bump is prevented and a pickup of an element chip to be performed after singulation becomes easy. In Japanese Patent Unexamined Publication No. 2002-93749, a technique in which plasma etching (plasma dicing) for singulation is performed in a state where the electrode pad is exposed to a surface of the circuit layer is disclosed.

SUMMARY

An element chip manufacturing method of the present disclosure includes preparing a substrate including a first face on which a metal electrode is exposed, a second face located at a side opposite to the first face, a plurality of element regions on each of which the metal electrode is formed, and a dividing region defining each of the element regions, forming a mask which covers the metal electrode along the metal electrode in the first face of the substrate and has an opening exposing the dividing region, and singulating the substrate by exposing the first face of the substrate to first plasma and etching the dividing region, which is exposed to the opening, until the second face is reached in a state where the metal electrode is covered by the mask.

According to the present disclosure, the metal electrode is masked so as to make it possible to prevent degradation of the metal electrode by plasma processing in manufacturing the element chip by plasma etching.

DETAILED DESCRIPTION

Figure 1A:
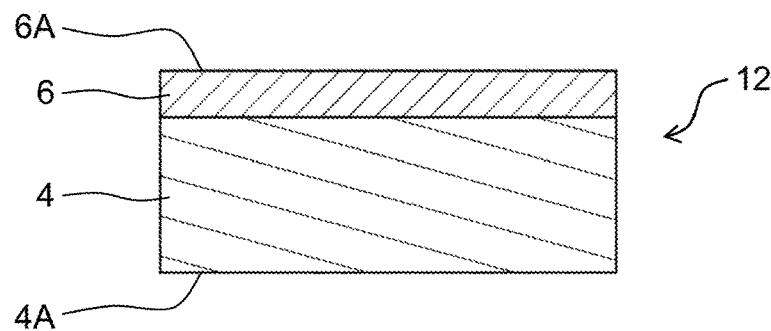
FIG. 1A is a first process diagram of an element chip manufacturing method according to a first exemplary embodiment.

Prior to descriptions of exemplary embodiments, problems of the prior art are briefly described.

In a case the substrate in which a metal electrode is exposed to a surface of a circuit layer is plasma diced from a circuit layer side, when the metal electrode is exposed to plasma and is etched, a metallic material constituting the metal electrode is scattered. When the scattered metallic material is attached to the inside of the plasma processing device, generation of plasma may become unstable or contamination of the substrate which is a plasma etching target with metal may be caused. When the scattered metallic material is attached to the substrate again, the scattered metallic material becomes a fine mask (micromask) and a desired plasma etching shape is not obtained. Furthermore, the scattered metallic material is attached to the substrate again or a portion of the metal electrode is etched such that degradation in electrical device characteristics and reliability of an element chip to be obtained may be caused.

On the other hand, although a method in which a resist mask covering the metal electrode is formed and the plasma dicing from the circuit layer side is performed in order to prevent the metal electrode from being irradiated with plasma and including an opening in the dividing region may be considered, this method also has three problems to be solved indicated in the following.

Firstly, in this case, the metal electrode needs to be covered with a mask having a sufficient thickness such that the metal electrode is not exposed during etching for singulating the substrate. Although the resist mask is generally formed by performing rotary coating (spin coating) on the substrate with resist liquid, in a case of spin coating, resist liquid has flowability and thus, a resist film thickness of a projecting portion of the surface of the substrate, that is, a head top part of the metal electrode such as the bump becomes thinner. In a case where the substrate having a flat surface of a thickness T is plasma-diced, a needed film thickness M of the mask is at least T/R or more by using a mask selectivity R under the etching condition thereof, and generally, it is sufficient for the mask film thickness M to be set to T/R×1.1 to T/R×2.0 by taking process variations into account. However, in a case where the bump is present in the surface of the substrate, as described above, the resist film thickness of the head top part of the bump becomes thinner and thus, the resist film thickness needs to be significantly increased so as not to expose the head top part of the metal electrode such as the bump during plasma dicing. Accordingly a use amount of the resist liquid is significantly increased, the time required for formation of the resist mask is increased, and production cost is increased.

Secondly although the resist mask needs to be removed by plasma ashing after being singulated by plasma etching, in a case where a thick resist mask is formed by spin coating, the time required for plasma ashing becomes longer and thus, productivity is reduced.

Thirdly, when the time required for plasma ashing becomes longer, the head top part of the metal electrode such as the bump is exposed to plasma for a long time during plasma ashing and thus, the surface of the metal electrode is easily oxidized and deterioration of device characteristics, for example, increase in contact resistance when electrical connection is performed is easily generated.

As such, the method in which a resist mask covering the metal electrode is formed and the plasma dicing from the circuit layer side is performed by spin coating in order to prevent the metal electrode such as the bump from being irradiated with plasma also has a problem to be solved such as reduction in productivity and degradation in device characteristics.

The present disclosure intends to reliably mask the metal electrode to prevent degradation of the metal electrode by plasma processing without sacrificing productivity or device characteristics in manufacturing of an element chip by plasma etching.

Hereinafter, exemplary embodiments will be described with reference to the drawings.

First Exemplary Embodiment

FIG. 1A to FIG. 1J illustrate a manufacturing process of semiconductor chip (element chip) 2 according to a first exemplary embodiment. When referring to the final process illustrated in FIG. 1J, manufactured semiconductor chip 2 includes semiconductor layer (first layer) 4, wiring layer (second layer) 6 formed on semiconductor layer 4, protective film 8 formed on wiring layer 6, and bump (projection electrode which is an example of a metal electrode according to the present disclosure) 10. Semiconductor chip 2 is formed by singulating semiconductor wafer 12. In the present exemplary embodiment, semiconductor layer 4 is made of Si or Si based material, wiring layer 6 is made of an insulation film such as $SiO_2$, and metal such as Cu. However, material of semiconductor layer 4 or wiring layer 6 is not limited thereto. For example, material of the insulation film of wiring layer 6 may be SiN, SiOC, a Low-k material, or the like. For example, material of metal of wiring layer 6 may be Al, Al alloy, W, or the like. Metals contained in bump 10 are not particularly limited and include, for example, copper, an alloy of copper, tin, and silver, an alloy of silver and tin, an alloy of tin and lead, gold, aluminum, and an aluminum alloy. The shape of bump 10 is not also particularly limited and may be a square pillar, a cylindrical pillar, a mound shape, a ball shape and the like. A height of bump 10 may be suitably set according to purposes and is, for example, 20 to 200 μm. The height of bump 10 has the maximum height of bump 10 in the normal direction of semiconductor layer 4. A disposition and the number of bumps 10 are not particularly limited and are suitably determined according to purposes.

In a first process (preparation process) illustrated in FIG. 1A, semiconductor wafer (substrate) 12 is prepared. Semiconductor wafer 12 includes semiconductor layer 4 and wiring layer 6 formed on semiconductor layer 4.

Figure 1B:
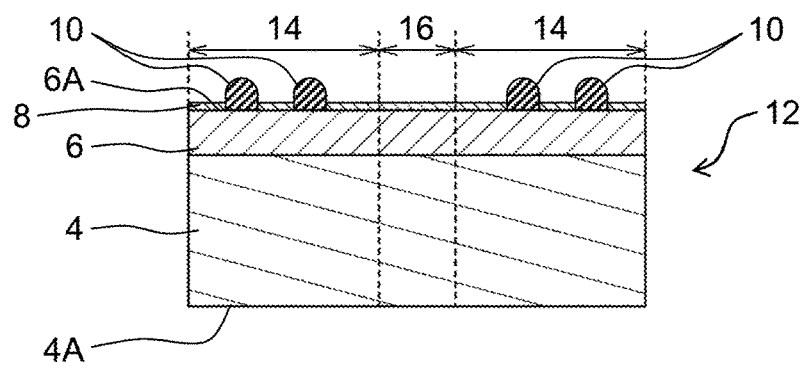
FIG. 1B is a second process diagram of the element chip manufacturing method according to the first exemplary embodiment.

In a second process (bump forming process) illustrated in FIG. 1B, protective film 8 and bump 10 are formed on surface (first face) 6A of wiring layer 6 of semiconductor wafer 12. Semiconductor wafer 12 includes a plurality of element regions 14 on which bumps 10 are formed and dividing regions 16 between element regions 14 adjacent to the periphery of respective element regions 14. In other words, respective element regions 14 are defined by dividing regions 16.

Figure 1C:
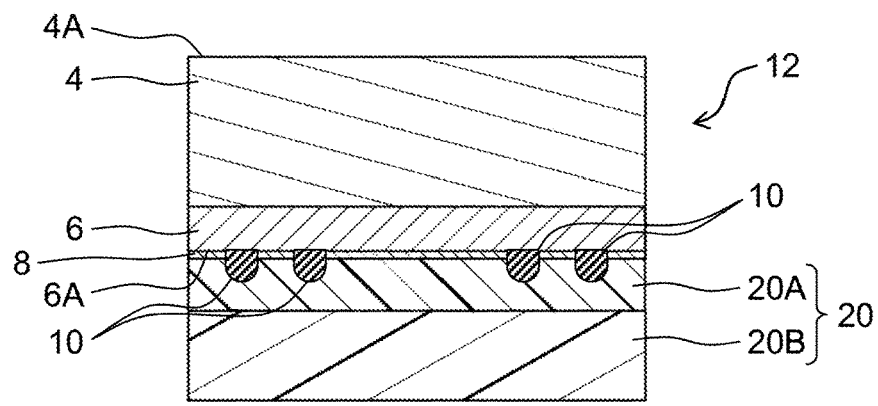
FIG. 1C is a third process diagram of the element chip manufacturing method according to the first exemplary embodiment.

In a third process (protection process) illustrated in FIG. 1C, BG (back grinding) tape (protection tape) 20 for protection at the time of backside grinding is attached to surface 6A of semiconductor wafer 12. BG tape 20 is a protection film formed with adhesive layer 20A and base material 20B made of resin. That is, adhesive layer 20A is attached to surface 6A of semiconductor wafer 12 and surface 6A of semiconductor wafer 12 is protected by base material 20B. BG tape 20 is cut in accordance with the outer shape of semiconductor wafer 12 after being attached to semiconductor wafer 12 or before being attached thereto and thus, handleability of semiconductor wafer 12 is not impaired.

Figure 1D:
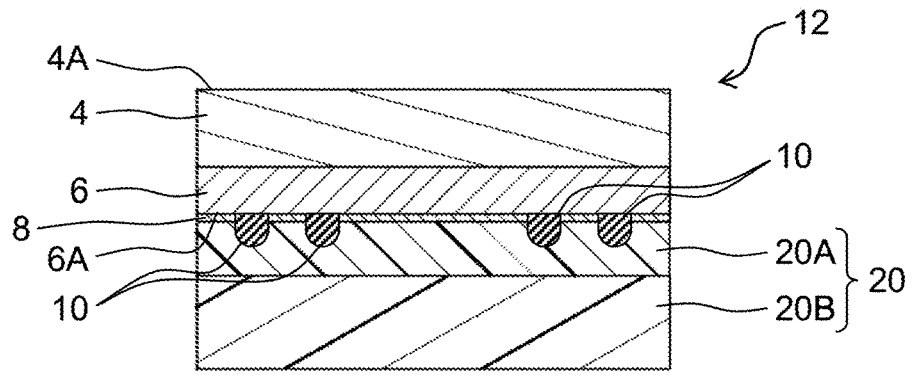
FIG. 1D is a fourth process diagram of the element chip manufacturing method according to the first exemplary embodiment.

In a fourth process (thinning process) illustrated in FIG. 1D, semiconductor layer 4 is ground from a rear surface (second face) 4A side of semiconductor wafer 12 by a grinding device (not illustrated). Semiconductor wafer 12 is made thinner to a desired thickness through grinding of semiconductor layer 4.

Figure 1E:
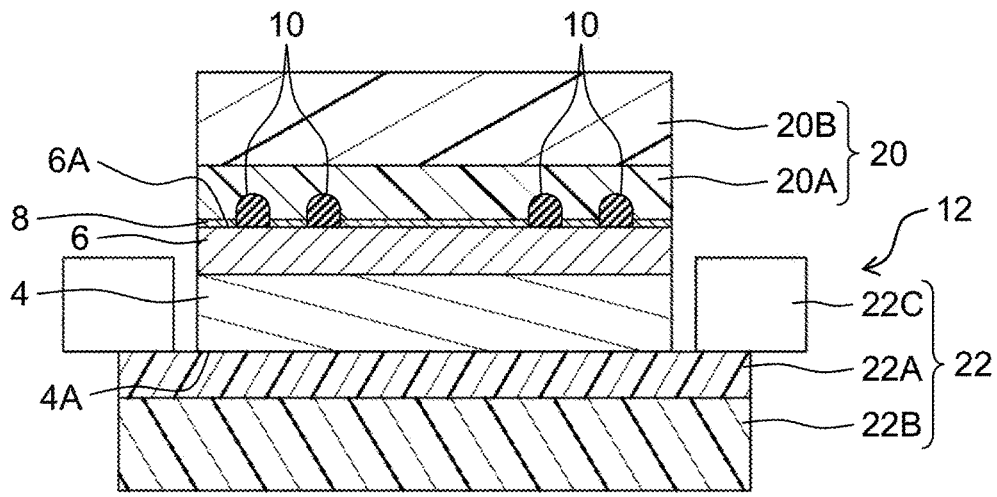
FIG. 1E is a fifth process diagram of the element chip manufacturing method according to the first exemplary embodiment.

In a fifth process (first holding process) illustrated in FIG. 1E, dicing tape (holding tape) 22 is attached to back side 4A of semiconductor wafer 12. Dicing tape 22 is a holding film formed with adhesive layer 22A and base material 22B made of resin. That is, adhesive layer 22A is attached to back side 4A of semiconductor wafer 12 and semiconductor wafer 12 is held by base material 22B. Frame 22C is attached to dicing tape 22 from a viewpoint of handleability.

Figure 1F:
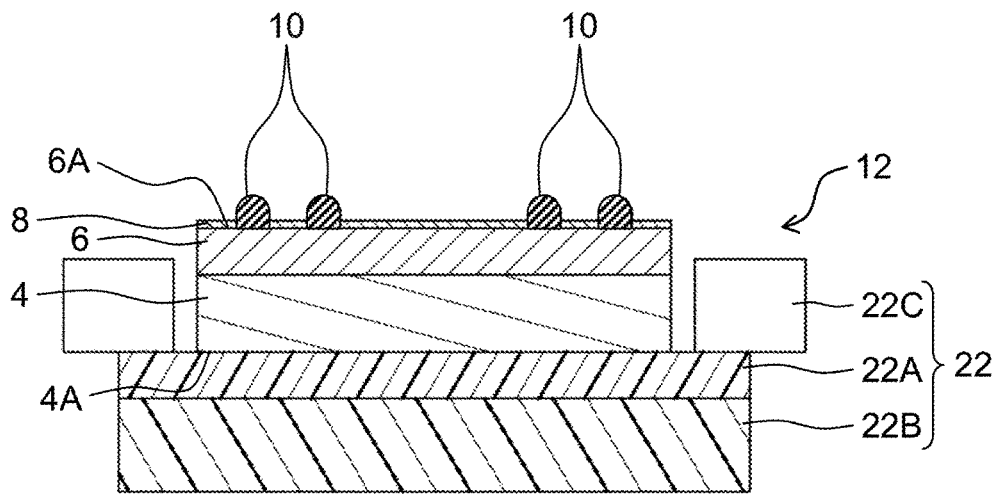
FIG. 1F is a sixth process diagram of the element chip manufacturing method according to the first exemplary embodiment.

In a sixth process (second holding process) illustrated in FIG. 1F, BG tape 20 is peeled off from semiconductor wafer 12 and is removed after dicing tape 22 attached with frame 22C is attached. In this state, bump 10 is exposed on surface 6A of semiconductor wafer 12.

Figure 1G:
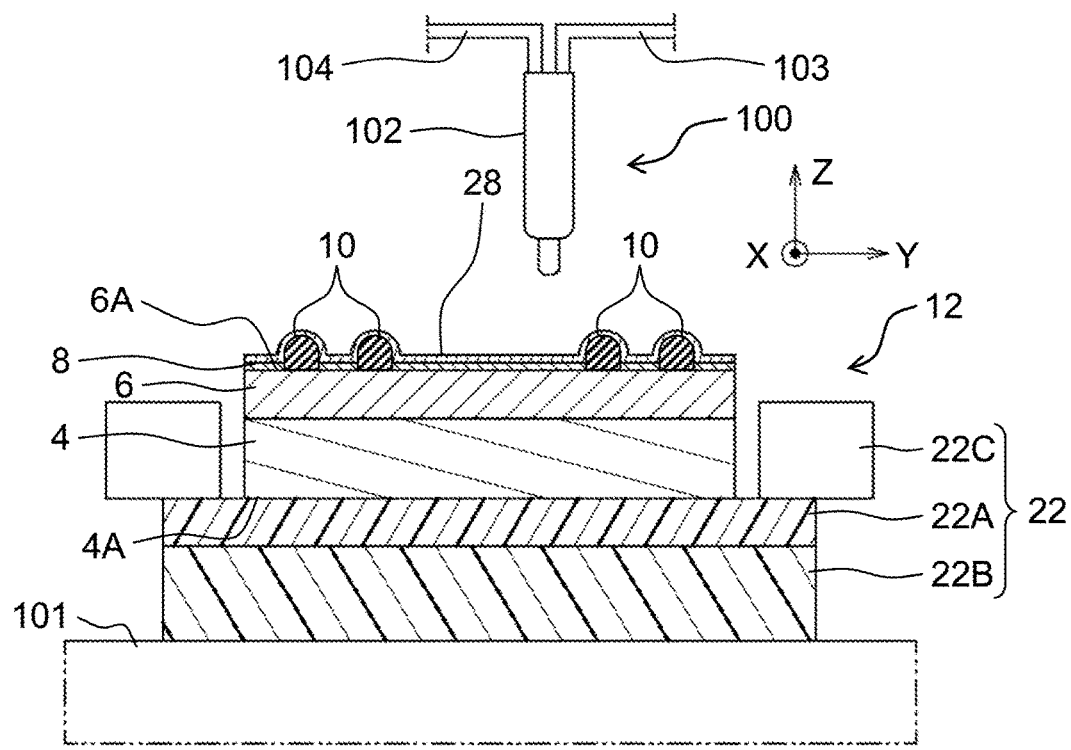
FIG. 1G is a seventh process diagram of the element chip manufacturing method according to the first exemplary embodiment.

In a seventh process (mask forming process) illustrated in FIG. 1G, mask 28 is formed on surface 6A of semiconductor wafer 12 by spray coating apparatus 100. Spray coating apparatus 100 includes stage 101 on which a processing target is placed and spray nozzle 102 provided on the upper part thereof. The spray nozzle is connected with pipe 103 for supplying raw material liquid and pipe 104 for supplying compressed gas and becomes possible to spray raw material liquid together with compressed gas to the processing target. Stage 101 is movable in a rotation direction within the X-Y plane (within horizontal plane) and spray nozzle 102 is movable in the X-axis direction, the Y-axis direction, and the Z-axis direction (vertical direction). Accordingly, wiping is performed with raw material liquid from spray nozzle 102 while moving the processing target and spray nozzle 102 so that a uniform coating becomes possible.

In the seventh process (mask forming process), raw material liquid obtained by mixing resist liquid with a solvent such as MEK (methyl ethyl ketone), PGMEA (propylene glycol monomethyl ether acetate) to dilute a viscosity thereof to approximately 20 cp together with compressed gas such as nitrogen are sprayed to surface 6A of semiconductor wafer 12 from spray nozzle 102 to form mask 28 made of resist on surface 6A of semiconductor wafer 12. At this time, it is possible to reduce a poor coating shape such as interruptions of mask 28 in an angle of a projection portion or film-thickening of mask 28 due to storing of resist in a concave portion and form uniform mask 28 even when unevenness due to bump 10 is present in surface 6A by adjusting parameters such as a pressure of compressed gas, a flow rate of raw material liquid, or a degree of dilution of resist liquid in advance and optimizing an attaching state or a drying state of mask 28 formed on surface 6A of semiconductor wafer 12. It is possible to uniformly form mask 28 on surface 6A of semiconductor wafer 12 by causing spray nozzle 102 to scan in the X-axis and the Y-axis directions and applying recoating as needed while slowly rotating stage 101.

As the spray coating conditions, it is possible that for example, a discharge rate of raw material liquid is set to 3 to 15 μl/sec, a scanning speed of spray nozzle 102 is set to 50 to 300 mm/sec, a temperature of stage 101 is set to the room temperature, a distance between spray nozzle 102 and stage 101 is set to 30 to 100 mm.

A plurality of materials such as metal constituting bump 10 or an insulation film made of polyimide, SiN, or the like and constituting protective film 8 on wiring layer 6 are present in surface 6A of semiconductor wafer 12 of which mask 28 is formed. The plurality of materials may have different wettability with respect to raw material liquid subjected to spray coating. Accordingly, it is preferable to homogenize wettability with respect to raw material liquid on surface 6A before spray coating. As a method for homogenization of wettability, cleaning processing of surface 6A, HMDS (hexamethyldisilazane) processing, plasma processing, or the like can be used.

The method of forming mask 28 along bump 10 is not limited to the spray coating described above. A chemical vapor deposition (CVD) method, plasma CVD method, or a sputtering method can be used.

An adhesive layer of adhesive tape may be transferred to surface 6A of semiconductor wafer 12 in order to form mask 28 along bump 10. In this case, the adhesive tape includes a tape base material and the adhesive layer formed on one face of the tape base material. The adhesive layer is tightly adhered to surface 6A by attaching one side of the adhesive layer of the adhesive tape to surface 6A of semiconductor wafer 12. The adhesive layer is formed in advance in such a way that adhesion strength between itself and surface 6A is greater than adhesion strength between itself and the base material, when the tape base material is peeled off, the adhesive layer is transferred onto surface 6A, and the adhesive layer becomes mask 28 along bump 10. The tape base material preferably includes cushioning properties relieving unevenness of bump 10 and in this case, the adhesive tape is pushed to semiconductor wafer 12 when the adhesive tape is attached to semiconductor wafer 12 and accordingly, adhesion between the adhesive layer and surface 6A is increased and it becomes easy to form mask 28 along bump 10.

The adhesive tape may further include a buffer layer and have a three-layer structure in which the tape base material, the buffer layer, and the adhesive layer are laminated in this order from the tape base material side. Also, in this case, the adhesive layer is tightly adhered to surface 6A by attaching a side of the adhesive layer of the adhesive tape to surface 6A of semiconductor wafer 12. The adhesive layer is formed in advance in such a way that adhesion strength between itself and surface 6A is greater than adhesion strength between itself and the buffer layer, when the tape base material together with the buffer layer are peeled off, the adhesive layer is transferred onto surface 6A, and the adhesive layer becomes mask 28 along bump 10. The buffer layer includes cushioning properties relieving unevenness of bump 10 and in this case, the adhesive tape is pushed to semiconductor wafer 12 when the adhesive tape is attached to semiconductor wafer 12 and accordingly, adhesion between the adhesive layer and surface 6A is increased and it becomes easy to form mask 28 along bump 10.

As the material of the tape base material, for example, polyester such as polyethylene terephthalate and polyimide are included. The thickness of the tape base material is not particularly limited, but preferably 30 to 150 μm from the point of view of handleability and functionality as a support.

The buffer layer preferably has flexibility enough to follow along at least the head top part of bump 10. Additionally, the buffer layer preferably has peelability enough to be peeled off from adhesive layer without damaging or peeling off surface GA. From a peelability point of view, an adhesive force between the buffer layer and the adhesive layer is preferably smaller than an adhesive force between surface 6A and the adhesive layer.

Such buffer layer is formed by a laminate structure of, for example, a layer which contains acrylic resin (acrylic resin layer) and a layer which contains silicone resin (silicone resin layer). In this case, an acrylic resin layer is disposed on a tape base material side. From the flexibility point of view, a thickness of the acrylic resin layer is preferably larger than that of the silicone resin layer. Particularly, the thickness of the acrylic resin layer is preferably 5 to 20 times the thickness of the silicone resin layer.

The thickness of the buffer layer is not particularly limited as long as at least the head top part of bump 10 is capable of being embedded into the head top part. The head top part of bump 10 is a portion occupying a range extending from the top of bump 10 to a point which corresponds to one-third height of bump 10. That is, the thickness of the buffer layer is not particularly limited as long as the thickness is greater than or equal to one-third height of bump 10. Particularly, from a bump 10 protection point of view, the thickness of the buffer layer is preferably greater than the height of bump 10. On the other hand, from a cost point of view, the thickness of the buffer layer is preferably less than or equal to twice the height of bump 10. Specifically, the thickness of the buffer layer is 40 to 400 μm and may be 100 to 300 μm. For example, in a case where the height of bump 10 is 65 μm, the thickness of the buffer layer may be 115 μm. In this case, a thickness of the tape base material is, for example, 50 μm.

As the material of the adhesive layer, for example, ultraviolet ray curable resin is included. The thickness of the adhesive layer is preferably, for example, 5 to 20 microns, and is, for example, about 10 microns.

Figure 1H:
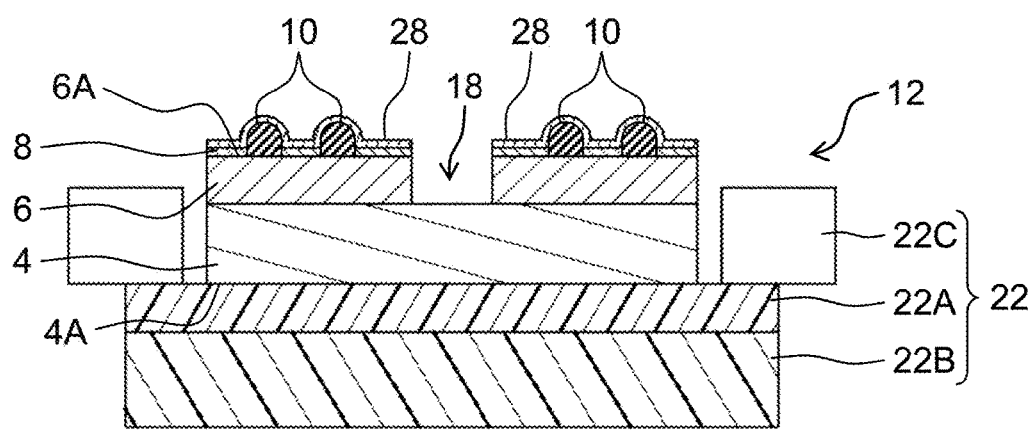
FIG. 1H is an eighth process diagram of the element chip manufacturing method according to the first exemplary embodiment.

In the eighth process (exposed portion forming process) illustrated in FIG. 1H, exposed portion 18 is formed in dividing region 16. Exposed portion 18 is formed by cutting wiring layer 6, protective film 8, and mask 28 by laser scribing, mechanical dicing, or the like. Semiconductor layer 4 is exposed in exposed portion 18 when seen from a surface 6A side of semiconductor wafer 12.

Figure 1I:
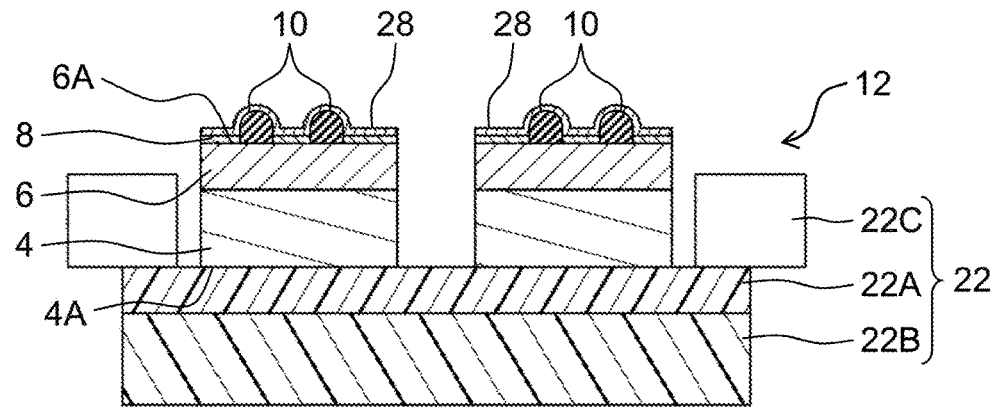
FIG. 1I is a ninth process diagram of the element chip manufacturing method according to the first exemplary embodiment.
Figure 1J:
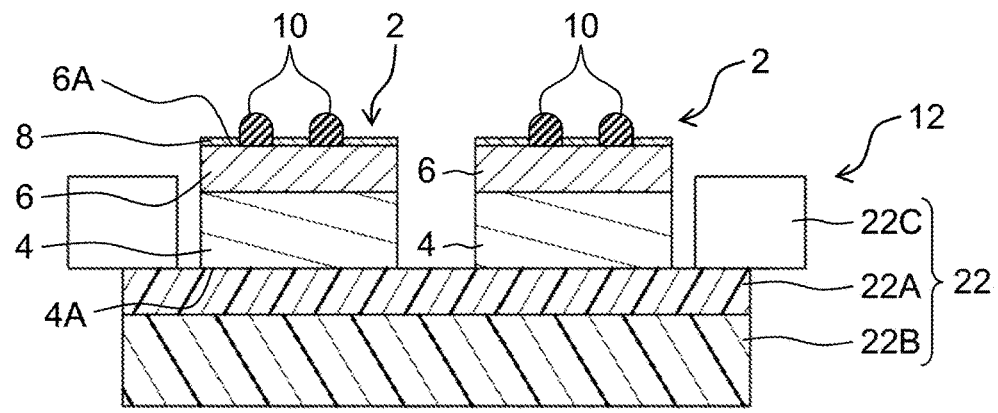
FIG. 1J is a tenth process diagram of the element chip manufacturing method according to the first exemplary embodiment.
Figure 1K:
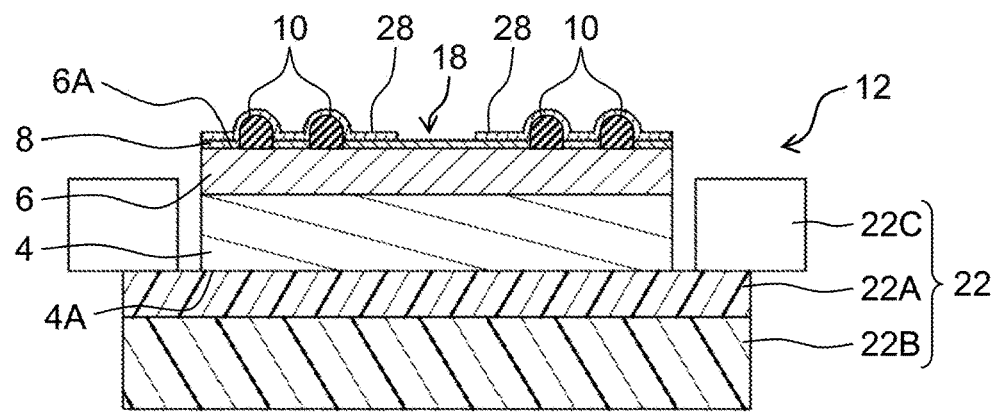
FIG. 1K is another eighth process diagram of the element chip manufacturing method according to the first exemplary embodiment.

A method, which is different from the above-described method, as illustrated in FIG. 1K, in which exposing and developing are performed on mask 28, an opening is formed on a portion corresponding to dividing region 16 of mask 28, and then, protective film 8 and wiring layer 6 are etched, and exposed portion 18 is formed may be adopted.

Figure 2:
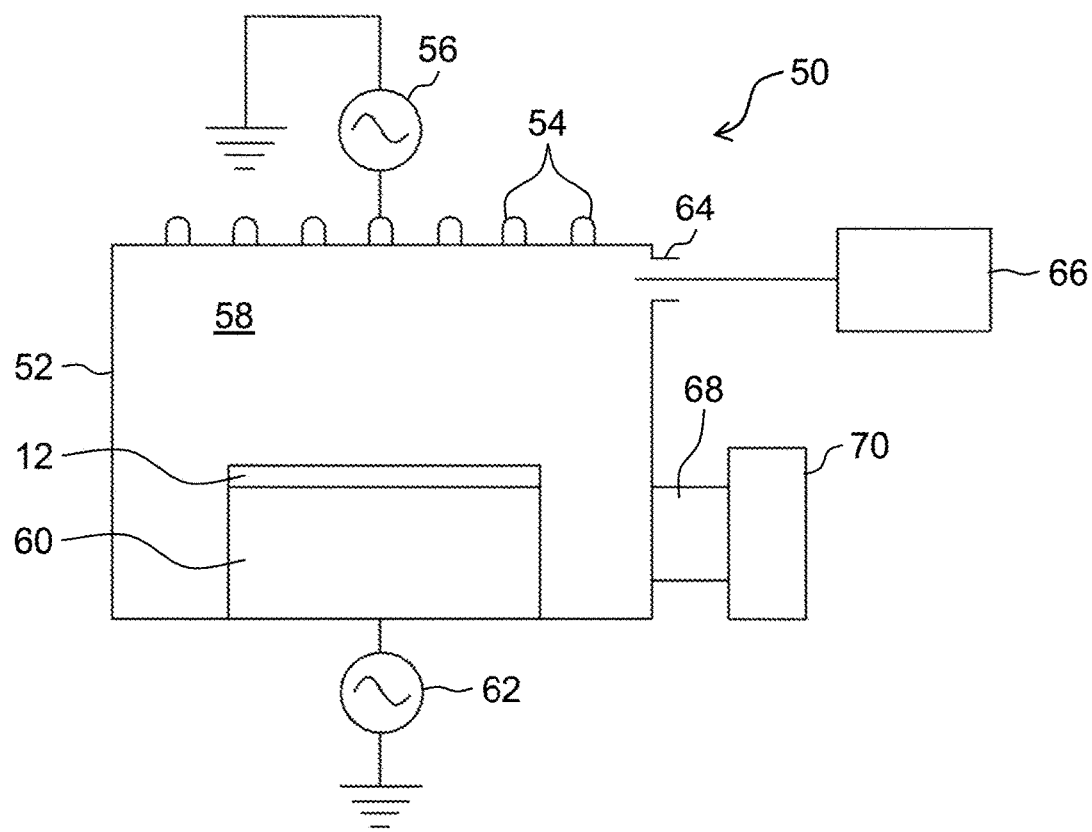
FIG. 2 is a schematic diagram of a plasma etching apparatus according to an exemplary embodiment.

In the ninth process (singulation process) illustrated in FIG. 1I, semiconductor wafer 12 is singulated by plasma processing. FIG. 2 illustrates an example of dry etching apparatus (plasma etching apparatus) 50 used in the present process. A dielectric window is provided on the top part of chamber 52 of dry etching apparatus 50 and antenna 54 is disposed above the dielectric window as an upper electrode. Antenna 54 is electrically connected with first high frequency power source unit 56. On the other hand, stage 60, on which semiconductor wafer 12 is disposed, is disposed at the bottom side of processing chamber 58 within chamber 52. Stage 60 also functions as a lower electrode and is electrically connected to second high frequency power source unit 62. Stage 60 includes an electrode for electrostatic suction (ESC electrode) which is not illustrated and is able to electrostatically suck semiconductor wafer 12 disposed on stage 60. Stage 60 is provided with a hole for cooling gas which is not illustrated for supplying cooling gas and cooling gas such as helium is supplied from the hole for cooling gas so as make it possible to cool down semiconductor wafer 12 electrostatically sucked on stage 60. Gas introduction port 64 of chamber 52 is fluidally connected to etching gas source 66 and exhaust port 68 is connected to vacuum exhaust unit 70 including a vacuum pump for evacuating the inside of chamber 52.

In the ninth process (singulation process), semiconductor wafer 12 after the seventh process (mask forming process) and after the fifth and sixth processes (first and second holding processes) is placed on the stage through dicing tape 22. After the completion of placement, the inside of processing chamber 58 is evacuated by vacuum exhaust unit 70 and etching gas which is, for example, $SF_6$ is supplied into processing chamber 58 from etching gas source 66 to maintain the chamber at predetermined pressure. Thereafter, high-frequency power is supplied from first high frequency power source unit 56 to antenna 54 to generate plasma (first plasma) in processing chamber 58 so as to allow semiconductor wafer 12 to be irradiated with plasma. Semiconductor layer 4 of semiconductor wafer 12 exposed in exposed portion 18 is removed by a physicochemical action of radicals and ions within plasma.

A plasma generation condition is set according to material or the like of an etched layer (semiconductor layer 4). For example, in a case where semiconductor layer 4 is Si, semiconductor layer 4 can be removed by Bosch process which will be described later.

In the Bosch process, semiconductor layer 4 is vertically etched in a depth direction. In a case where semiconductor layer 4 contains Si, a protective film deposition step, a protective film etching step, and Si etching step are sequentially repeated to excavate semiconductor layer 4 in the depth direction, in the Bosch process.

The protective film deposition step is performed, for example, under the processing condition that a pressure inside chamber 52 is adjusted to 15 to 25 Pa, electric power of 1500 to 2500 W is input to antenna 54 from first high frequency power source unit 56, and electric power of 0 to 50 W is input to the lower electrode from second high frequency power source unit 62, for 2 to 15 seconds, while supplying $C_4F_8$ of 150 to 250 sccm as raw material gas.

The protective film etching step is performed, for example, under the processing condition that a pressure inside chamber 52 is adjusted to 5 to 15 Pa, electric power of 1500 to 2500 W is input to antenna 54 from first high frequency power source unit 56, and electric power of 300 to 1000 W is input to the lower electrode from second high frequency power source unit 62, for 2 to 10 seconds, while supplying $SF_6$ of 200 to 400 sccm as raw material gas.

The Si etching step is performed, for example, under the processing condition that a pressure inside chamber 52 is adjusted to 5 to 15 Pa, electric power of 1500 to 2500 W is input to antenna 54 from first high frequency power source unit 56, and electric power of 50 to 500 W is input to the lower electrode from second high frequency power source unit 62, for 10 to 20 seconds, while supplying $SF_6$ of 200 to 400 sccm as raw material gas.

Under the conditions described above, the protective film deposition step, the protective film etching step, and the Si etching step are repeated to thereby make it possible to vertically etch semiconductor layer 4 which contains Si in the depth direction at a rate of 10 μm/min.

In the eighth process (exposed portion forming process), in a case where exposed portion 18 is formed by laser scribing, mask 28 and wiring layer 6 are processed by laser abrasion. In laser abrasion, processing is performed in such a way that mask 28 and wiring layer 6 are caused to absorb energy of laser beams, occurrence of a local high temperature is caused, and a portion which is under the high temperature is evaporated. For that reason, laser beams having a wavelength capable of being easily absorbed by mask 28 and wiring layer 6 are used.

As laser beams, for example, YAG laser having a wavelength of 355 nm (third harmonic) can be used. This is because the wavelength becomes easy to be absorbed into metal contained in wiring layer 6 and is also easily absorbed into a UV absorbable organic material such as resist constituting mask 28.

A material capable of easily absorbing the wavelength of laser beams may be added to mask 28 in order to facilitate absorption of laser beams. For example, as described in description of the mask forming process, in a case where the adhesive layer of the adhesive tape is transferred onto surface 6A of semiconductor wafer 12 to be formed as a mask, it is preferable to add a UV cross-linked material capable of easily absorbing UV light to the adhesive layer.

When absorption of laser beams in mask 28 and wiring layer 6 is small, although an excessive quantity of a portion of emitted laser beams may reach semiconductor layer 4 to be absorbed and a processed shape is deteriorated, as described above, the wavelength of laser beams or the material of mask 28 is suitably selected such that absorption of energy of laser beams is optimized to obtain an excellent processed shape in mask 28.

When laser beams are continuously irradiated (CW), laser beams become unstable or too much power of laser beams are input and thus, it is preferable that laser beams are irradiated in a pulse shape. With this, it becomes possible to perform processing by locally applying power of laser beams while suppressing the spread of heat. As the pulse irradiation conditions, a pulse width of 5 to 50 nanoseconds, energy of 5 to 50 μJ, and the number of repetitions of 50 to 150 kHz may be exemplified. It is preferable that laser beams are irradiated while laser beam scanning is performed at a speed of 400 to 700 mm/sec. Although mask 28 and wiring layer 6 may be removed at one time irradiation, mask 28 and wiring layer 6 may be removed by superposing irradiations in a plurality of number of times.

It is possible to enhance perpendicularity of the processed shape and reduce occurrence of debris which will be described later by superposing irradiations a plurality of number of times.

Foreign matter referred to as debris may remain in the periphery of the portion of mask 28 which is processed by laser beams, on a side surface of mask 28 or wiring layer 6 which is processed, or on a bottom surface of the processed portion. Debris becomes a mixture of an organic component (carbon) constituting mask 28, an insulation film ($SiO_2$, Low-k material, or the like) constituting wiring layer 6, and metal (Al, Cu, or the like) constituting wiring layer 6.

When debris remains in the portion processed by laser beams, 1) unevenness is formed on the side surface of exposed portion 18 and linearity of dividing region 16 is damaged, 2) the bottom surface of exposed portion 18 becomes a tailing shape (a state where a residue remains), 3) a situation that debris is attached to the bottom surface of exposed portion 18 is caused and exposure of semiconductor layer 4 becomes insufficient.

Accordingly, when plasma dicing is performed in a situation that debris remains on the portion processed by laser beams in the singulation process, in the case of 1) described above, debris remaining on the side surface of exposed portion 18 becomes an etching mask, unevenness is transferred onto the side surface of singulated semiconductor chip 2, and thus, a problem that smoothness of the side surface of a chip is damaged when seen from above occurs.

In the case of 2) described above, when plasma dicing is performed in a state where the bottom surface of exposed portion 18 is in a trailing shape, a problem that the residue disappears on the way of etching such that a columnar or a needle-shaped projection portion is formed on the side surface of singulated semiconductor chip 2 along an etching direction.

In the case of 3) described above, when plasma dicing is performed in a state where debris is attached to the bottom surface of exposed portion 18 and exposure of semiconductor layer 4 is insufficient, a problem that a columnar residue occurs or an etching stop occurs in dividing region 16 occurs.

Accordingly, after laser abrasion, plasma processing (descumming processing) for removing debris needs to be performed before plasma dicing processing.

In descumming processing, as described above, for example, debris having a composition in which the metal component such as Al or Cu is mixed in a mixture which contains carbon or $SiO_2$ as a main component needs to be removed. For that reason, in descumming processing, plasma of gas (for example, $CF_4/O_2$) which contains oxygen for facilitating removal of carbon and fluorine having a high cleaning effect is preferably used. Furthermore, it is preferable that high-frequency power to be input to the lower electrode is set to be larger and increase sputterability compared to a case where semiconductor layer 4 is etched by plasma dicing in order to facilitate removal of the metal component.

In a case where a lot of metal components are contained in debris components, it is preferable that gas (for example, $CF_4/O_2/Ar$) which contains argon (Ar) in order to increase sputterability is used.

In order to increase reactivity between the metal component such as Al or Cu and plasma to remove the metal component, it is preferable to add gas (for example, $CHF_3$, $H_2$, $CH_4$) which contains hydrogen to the gas system ($CF_4/O_2$ or $CF_4/O_2/Ar$) described above to generate a carboxyl group (—COOH) in plasma.

Generally, since saturated steam pressure of a complex of metal is low, the metal component is easily removed by generating a carboxyl group (—COOH) in plasma to be reacted with the metal component. As a gas system, $CHF_3/O_2/Ar$, $CF_4/O_2/Ar/H_2$ or $CH_4$, $CF_4/CO_2/Ar$ or $CH_4$, or the like may be exemplified.

Descumming processing may be conducted in the same processing chamber as a processing chamber in which the singulation process is performed. This is because in a case where the number of times of processing is small, a case where an area of exposed portion 18 is small and an amount of foreign matter is small, a case where an amount of metal contained in wiring layer 6 is small, or a case where metal is not present in wiring layer 6 of dividing region 16, a scattered amount of the metal components contained in foreign matter due to descumming processing into the processing chamber is negligible.

However, when the scattered amount of the metal components contained in foreign matter due to descumming processing into the processing chamber is large, a problem that a portion of the scattered amount of the metal components is attached to the dielectric window, a transmission of a magnetic field for plasma generation generated by antenna 54 is blocked, generation of plasma becomes unstable, or reproducibility and stability of etching becomes lower occurs. Accordingly, in a case where the amount of the metal component scattered and attached to the processing chamber due to descumming processing is large, descumming processing is desirably conducted in a processing chamber which is different from the processing chamber in which the singulation process is performed. Although in a case where descumming processing is conducted in the same processing chamber as a processing chamber in which the singulation process is performed, it is desirable that chlorine gas is not used in descumming processing in order to prevent residual of chlorine in a device or corrosion of the device, in a case where descumming processing is conducted in a different processing chamber, chlorine gas may be added in order to enhance capability of metal remove. When gas which contains C (carbon), O (oxygen), and H (hydrogen), for example, mixed gas of CO and $NH_3$ is used during descumming processing, scattered metal components can be caused to react with the COOH group formed in plasma to remove the metal components and thus, it is possible to prevent the metal component from being attached into the processing chamber.

In the tenth process (ashing process) which is the final process illustrated in FIG. 1J, etching gas which is, for example, oxygen is supplied into processing chamber 58 from etching gas source 66 to maintain the chamber at predetermined pressure while evacuating the inside of processing chamber 58. In this state, high-frequency power is supplied from first high frequency power source unit 56 to antenna 54 to generate plasma (second plasma) in processing chamber 58 so as to allow semiconductor wafer 12 to be irradiated with plasma. Mask 28 is completely removed from surface 6A of semiconductor wafer 12 by plasma irradiation. Ashing is performed, for example, under the processing condition that a pressure inside chamber 52 is adjusted to 5 to 30 Pa, electric power of 1500 to 2500 W is input to antenna 54, and electric power of 0 to 300 W is input to the lower electrode, while supplying mixed gas ($CF_4$: $O_2$=1:100) $CF_4$ and $O_2$ of 200 to 500 sccm as raw material gas.

In a case of the present exemplary embodiment, since forming of mask 28 is performed by spray coating, the variation in the thickness of mask 28 on bump 10 is small and over-etching of ashing can be suppressed. Accordingly, a problem that the head top part of bump 10 is exposed to ashing plasma for a long time and thus, the surface of bump 10 is oxidized and deterioration of device characteristics, for example, increase in contact resistance when electrical connection is performed is easily generated is hard to occur.

It is preferable that plasma dicing and ashing are performed in the same chamber. The reason will be described in the following.

In plasma dicing, a voltage is applied to the ESC electrode, the Colomb force is generated between the ESC electrode and semiconductor wafer 12, semiconductor wafer 12 is electrostatically sucked through dicing tape 22.

Since semiconductor wafer 12 is a single unit until semiconductor wafer 12 is singulated, the variation of the charged state in the surface of semiconductor wafer 12 hardly occurs and semiconductor wafer 12 can be stabilized and sucked.

On the other hand, after semiconductor wafer 12 is singulated into semiconductor chips by plasma dicing, respective semiconductor chips are held on dicing tape 22 by being separated from each other.

In a case where semiconductor wafer 12 which is singulated is transported to another plasma processing apparatus in a state of being held in dicing tape 22 and subjected to plasma processing such as ashing, it is difficult to uniformly electrostatically suck the semiconductor wafer. This is because in a case where semiconductor wafer 12 is singulated, non-uniformization easily occurs in a suction force and suction failure is easily generated by a slight variation in the charged state of each semiconductor chip or the held state of each semiconductor chip due to dicing tape 22 with generating the Colomb force between the stage and each semiconductor chip so as to suck the semiconductor chip to the stage.

From those reasons, it is preferable that ashing processing after plasma dicing is performed in the same chamber. With this, after the completion of plasma dicing, it is possible to perform ashing processing in a state where an excellent electrostatically sucked state of semiconductor wafer 12 is maintained during plasma dicing while singulated semiconductor wafer 12 and dicing tape 22 are placed on stage 60. As a method for maintaining an excellent electrostatically sucked state, a continuous application of a voltage to the ESC electrode provided in stage 60 while generating weak plasma discharge after the completion of plasma dicing may be allowed. Otherwise, charges on semiconductor wafer 12 may be allowed to remain and an electrostatically sucked state may be maintained by the residual charges without performing processing (electrostatic discharging processing) for removing charges on semiconductor wafer 12 after plasma dicing.

In plasma dicing, for example, semiconductor layer 4 made of Si is processed by cyclic etching (so-called BOSCH process) in which an etching step by plasma which contains $SF_6$ and a deposition step by plasma which contains $C_4F_8$ are repeated. A polymerization film made of fluorocarbon is deposited on the mask in the deposition step and Si is removed by reactivity etching by fluorine radical in etching step to thereby make it possible to process the semiconductor wafer with a high selectivity having a mask selectivity greater than 100. In this case, a fluorocarbon film to be deposited on the mask becomes an etched polymerization film which contains Si.

Dicing tape 22 made of resin materials is poor in heat resistance and needs to be maintained at a low temperature (less than 100° C., preferably less than 60° C.) during plasma dicing and ashing in order to prevent thermal elongation and burning. Accordingly, in ashing, it is required that the mask attached with polymerization film which contains Si is removed at a low temperature at high speed without generating the residue.

For that reason, in ashing, mixed gas which contains oxygen ($O_2$) as a main component in order to remove organic matter which is a main component of resist and to which fluorine-containing gas such as $CF_4$ or $CHF_3$ in order to remove a mask attached with Si is added by about several % to 20% on a flow rate ratio with respect to $O_2$ basis is used. Furthermore, it is preferable that in order to perform ashing at a low temperature at high speed without causing the residue, high-frequency power (for example, 2000 W or more) is applied to antenna 54 and weak high-frequency power (for example, about 500 W or less in a case where a diameter of the lower electrode is 300 mm) is also applied to the lower electrode.

However, in this case, a small fraction of the surface of the bump sputtered by plasma and a small fraction of metal components contained in bump 10 may be scattered into the processing chamber. In this case, a problem that the metal components contained in bump 10 is attached to the dielectric window, the transmission of the magnetic field for plasma generation generated by antenna 54 is blocked, generation of plasma becomes unstable, or reproducibility and stability of etching becomes lower is likely to occur.

In order to suppress such problem, it is preferable that hydrogen-containing gas (for example, $H_2$, $CH_4$) is added to oxygen and fluorine containing gas (for example, $O_2/CF_4$ or $O_2/CHF_3$) to generate a carboxyl group (—COOH) in plasma. Generally, since saturated steam pressure of a complex of metal is low, the metal component is easily removed by generating a carboxyl group (—COOH) in plasma to be reacted with the metal component.

By the first to the tenth processes described above, semiconductor chip 2 is manufactured in a state of being held on dicing tape 22. Although semiconductor chip 2 is taken out from dry etching apparatus 50 and is delivered to a post-process, semiconductor wafer 12 (aggregate of semiconductor chip 2) in a state of being divided is held on dicing tape 22 attached with frame 22C and thus, handling of the semiconductor chip in the post-process is easy.

Description will be made on effects due to matters that mask 28 is formed not by spin coating, but by spray coating. According to this method, since spray coating method is adopted when mask 28 is formed on semiconductor wafer 12, it is possible to surely cover the entire surface of bump 10. In other words, it is possible to surely avoid matters that mask 28 is not partially formed on the surface of bump 10 and remains as it is. For that reason, when semiconductor wafer 12 is singulated by plasma etching, bump 10 is surely protected, and it is possible to prevent degradation of bump 10 due to plasma processing. Specifically, in the spray coating method, since liquid resist is sprayed by spraying, it is possible to surely cover the surface of bump 10 following a shape of bump 10 without being depended on the shape of bump 10. For that reason, it is possible to perform plasma processing also on semiconductor wafer 12 of bump 10 having various shapes by the same method and manufacturing efficiency of semiconductor chip 2 is enhanced.

Figure 3A:
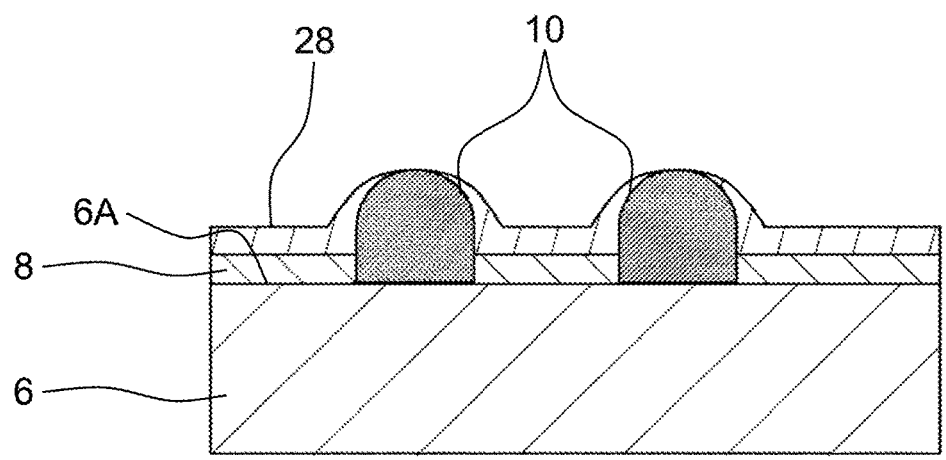
FIG. 3A is a schematic diagram illustrating a mask by a spin coating method.
Figure 3B:
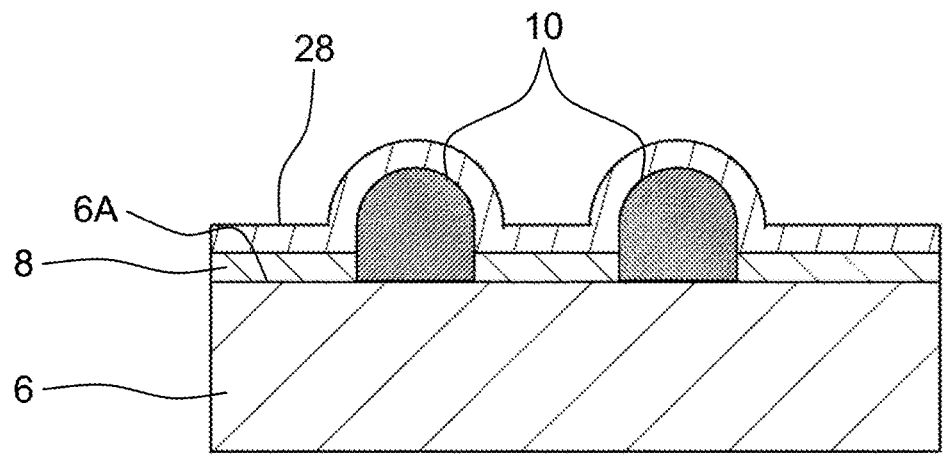
FIG. 3B is another schematic diagram illustrating a mask by a spray coating method.

In FIG. 3A and FIG. 3B, a difference in coating by the spin coating method and the spray coating method is schematically illustrated. Although FIG. 3A illustrates a case of coating by the spin coating method, in the spin coating method, coating in which a sufficient amount of liquid resist does not arrive at the head top part of bump 10 and the head top part of bump 10 with mask 28 is thin and insufficient is caused. In contrast, although FIG. 3B illustrates a case of coating by the spray coating method, in the spray coating method, since liquid resist is sprayed by spraying, coating in which a sufficient amount of liquid resist arrives at the head top part of bump 10 and the head top part of bump 10 is also sufficiently coated is caused. As such, in a case of bump 10 having a highly protruding shape, since coating of the head top part of bump 10 is frequently insufficient in the spin coating method, it is effective to adopt the spray coating method as described above.

Effects caused by matters that bump 10 is covered by mask 28 will be described. According to the present exemplary embodiment, it is possible to form mask 28 surely covering the entire surface of bump 10 with respect to semiconductor wafer 12 by the spray coating method. Accordingly, bump 10 becomes hard to be exposed to plasma, scattering of the metal materials constituting bump 10 due to plasma etching is suppressed, attaching of the scattered metal materials to the inner wall of the plasma processing chamber or re-attaching of the scattered metal materials to substrate 12 is suppressed. With this, effects corresponding to the following six problems to be solved are obtained.

Firstly, in the related art, there was a problem to be solved that in a case where the plasma processing chamber is provided with an inductively-coupled plasma source and includes the dielectric window for allowing a magnetic field for plasma generation to be transmitted, when the metal materials with inferior reactivity such as gold, copper, or nickel due to bump 10 are exposed to plasma to be scattered and are attached to the dielectric window, transmission of the magnetic field for plasma generation is blocked, generation of plasma becomes unstable, or reproducibility and stability of etching becomes lower.

On the other hand, according to the present exemplary embodiment, even in a case where the plasma processing chamber includes the dielectric window for allowing the magnetic field for plasma generation to be transmitted, since attaching of the metal materials due to bump 10 to the dielectric window is suppressed, generation of plasma is stable and reproducibility and stability of etching is enhanced.

Secondly, in the related art, there was a problem to be solved that when the metal materials constituting bump 10 are exposed to plasma to be scattered and attached to semiconductor wafer (substrate) 12 again, a micro-mask is caused at the time of plasma dicing and degradation of a chip shape such as roughening of a side surface or the like of semiconductor chip (element chip) 2 is caused. Such degradation of the chip shape was cause of reduction in flexural strength of the element chip or molding failure when packaging semiconductor chip 2.

On the other hand, according to the present exemplary embodiment, the micromask is hardly formed by the metal materials due to bump 10 during the plasma dicing and thus, semiconductor chip 2 excellent in smoothness of the side surface thereof is obtained. Accordingly, semiconductor chip 2 to be obtained is excellent in flexural strength and the molding failure is hard to occur when packaging elements in the element chip.

Thirdly, in the related art, there was a problem to be solved that when the metallic materials constituting bump 10 are exposed to plasma to be scattered and attached to dividing region 16 of semiconductor wafer 12 again, etching residue is generated on dividing region 16. Such an etching residue becomes the cause of particles generation, induces defective recognition and pickup failure in a pickup process after the plasma dicing, and yield in production is reduced. Furthermore, when an amount of etching residue generated in dividing region 16 is large, etching stop is generated in dividing region 16 and deterioration that semiconductor wafer 12 cannot be singulated is generated.

On the other hand, according to the present exemplary embodiment, the metal materials due to the bump do not become the micromask during the plasma dicing and etching residue is not generated in dividing region 16. Accordingly, an amount of particles is reduced and recognition performance and pickup performance are improved, and yield in production is enhanced in a pickup process after the plasma dicing. The etching stop is hardly generated in dividing region 16 during the plasma dicing and yield in production of singulation is enhanced.

Fourthly, in the related art, there was a problem to be solved that when the metallic material due to bump 10 is exposed to plasma to scattered and is re-attached to a portion (for example, a portion on protective film 8 of surface 6A of a circuit layer and a side surface of the semiconductor layer) other than bump 10 of the element chip, metal contamination of the element occurs.

On the other hand, according to the present exemplary embodiment, a situation that the metallic material due to bump 10 is re-attached to the portion (for example, a portion on protective film 8 of surface 6A of a circuit layer and a side surface of the semiconductor layer) other than bump 10 of semiconductor chip 2 and metal contamination of the element occurs is not caused.

Fifthly, in the related art, there was a problem to be solved that when a portion of bump 10 is etched, electrical characteristics of semiconductor chip 2 may be changed by re-attaching of the metal material due to bump 10 to semiconductor chip 2.

On the other hand, according to the present exemplary embodiment, a situation that a portion of bump 10 is etched, the metal material due to bump 10 is attached to semiconductor chip 2 again, and electrical characteristics of semiconductor chip 2 is changed is hard to occur.

Sixthly, in the related art, there was a problem to be solved that when bump 10 is exposed to plasma to be etched, quality of bump 10 is changed by plasma such that deterioration occurs. Specifically, there was a situation that in a case where bump 10 contains copper, when plasma processing using gas which contains sulfur hexafluoride ($SF_6$) is performed, copper is sulfurized with plasma irradiation and reliability is reduced. There was a situation that in a case where etching gas or ashing gas contains fluorine or oxygen, an increase in contact resistance or a decrease in connection strength and reduction in reliability occurs by fluorination or oxidation of the surface of bump 10. There was a situation that in a case where etching gas contains fluorocarbon-based gas such as $C_4F_8$, a reaction product which contains carbon is attached to the surface of the bump, reliability in connection strength reduces, is occurred.

On the other hand, according to the present exemplary embodiment, change in quality of bump 10 is hard to occur by plasma during plasma dicing. Accordingly, in a case where bump 10 contains copper, even when plasma processing using gas which contains sulfur hexafluoride ($SF_6$) is performed, copper is not sulfurized and reliability is enhanced. Even in a case where etching gas or ashing gas contains fluorine or oxygen, fluorination or oxidation of the surface of bump 10 is not caused and reliability of contact resistance, connection strength, or the like is enhanced. Even in a case where etching gas contains fluorocarbon-based gas such as $C_4F_8$, a reaction product is not attached to the surface of bump 10 and it is possible to enhance reliability of connection strength.

Additionally, according to the present exemplary embodiment, in the related art, in a case where plasma dicing is performed from a circuit layer side, a thick resist mask, which was needed in order not to allow the bump to be exposed to plasma, is not needed and it is possible to suppress an increase in manufacturing cost.

In the related art, there was a problem to be solved that in a case where a thick resist mask is used, plasma ashing for a long time is needed for removal of the resist mask after plasma dicing and the processing time is increased or another problem to be solved that deterioration of the device characteristics, for example, matters that the head top part of bump 10 is exposed to ashing plasma and the surface of bump 10 is oxidized and contact resistance is increased when electrical connection is performed becomes easy to occur.

On the other hand, in the present exemplary embodiment, since long ashing is not needed, the increase in processing time or degradation of device characteristics described above is hard to occur.

Second Exemplary Embodiment

In a manufacturing method of semiconductor chip 2 of the present exemplary embodiment of which respective processes are illustrated in FIG. 4A to FIG. 4K, the exposed portion forming process is performed before the mask forming process, unlike the first exemplary embodiment.

Same reference numerals are given to the same portions as those illustrated in FIG. 1A to FIG. 1J and description thereof will be omitted.

Figure 4A:
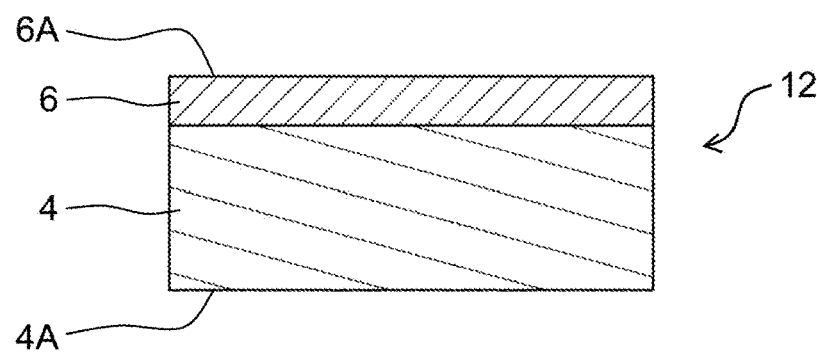
FIG. 4A is a first process diagram of an element chip manufacturing method according to a second exemplary embodiment.
Figure 4B:
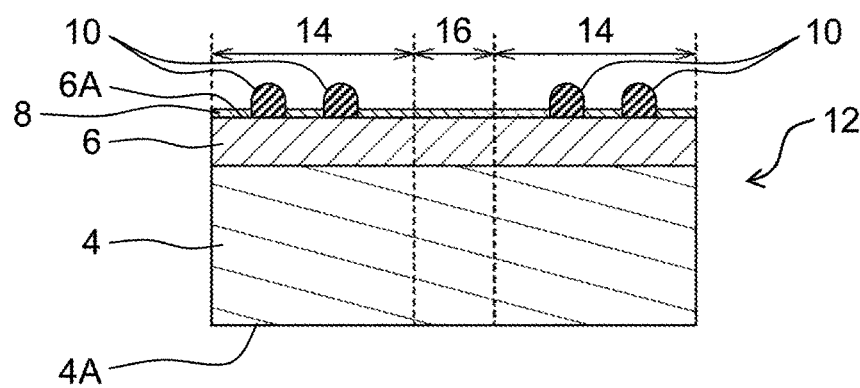
FIG. 4B is a second process diagram of the element chip manufacturing method according to the second exemplary embodiment.

The first process (preparation process) and the second process (bump forming process) of the present exemplary embodiment illustrated in FIG. 4A and FIG. 4B are the same as those of the first exemplary embodiment.

Figure 4C:
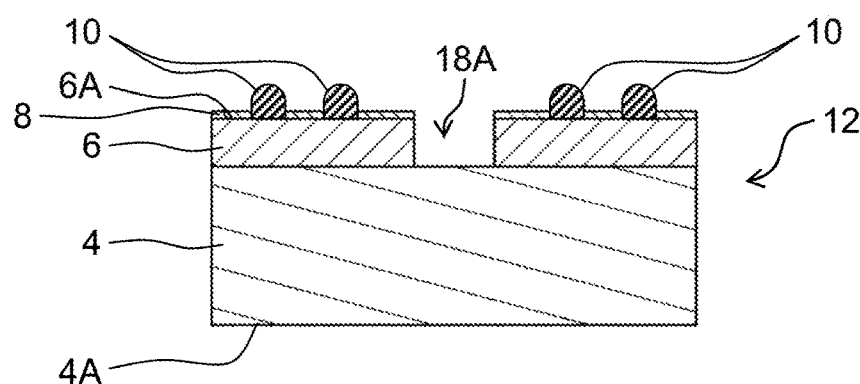
FIG. 4C is a third process diagram of the element chip manufacturing method according to the second exemplary embodiment.
Figure 4D:
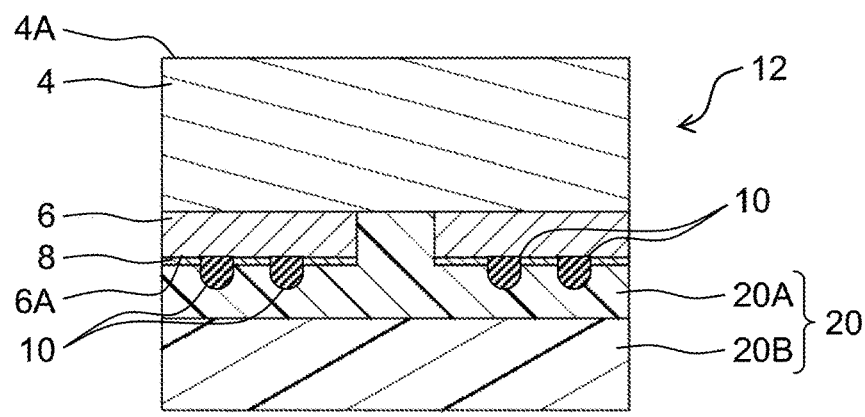
FIG. 4D is a fourth process diagram of the element chip manufacturing method according to the second exemplary embodiment.
Figure 4E:
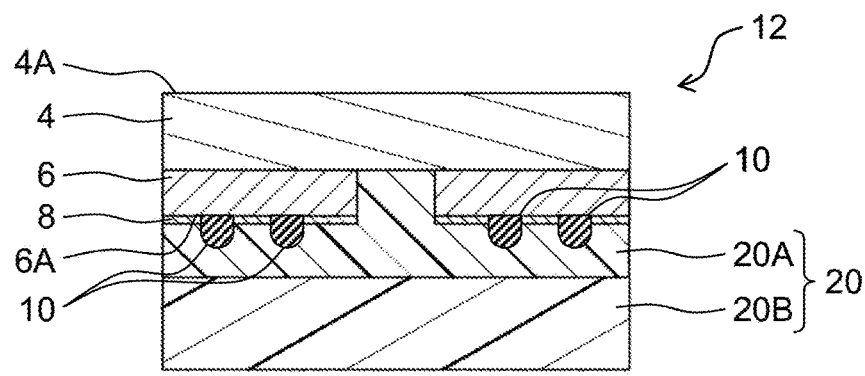
FIG. 4E is a fifth process diagram of the element chip manufacturing method according to the second exemplary embodiment.
Figure 4F:
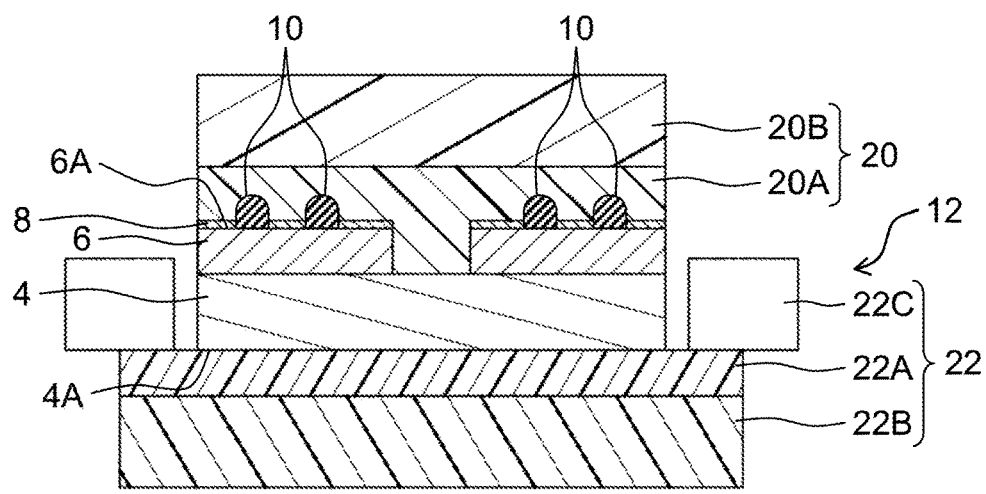
FIG. 4F is a sixth process diagram of the element chip manufacturing method according to the second exemplary embodiment.
Figure 4G:
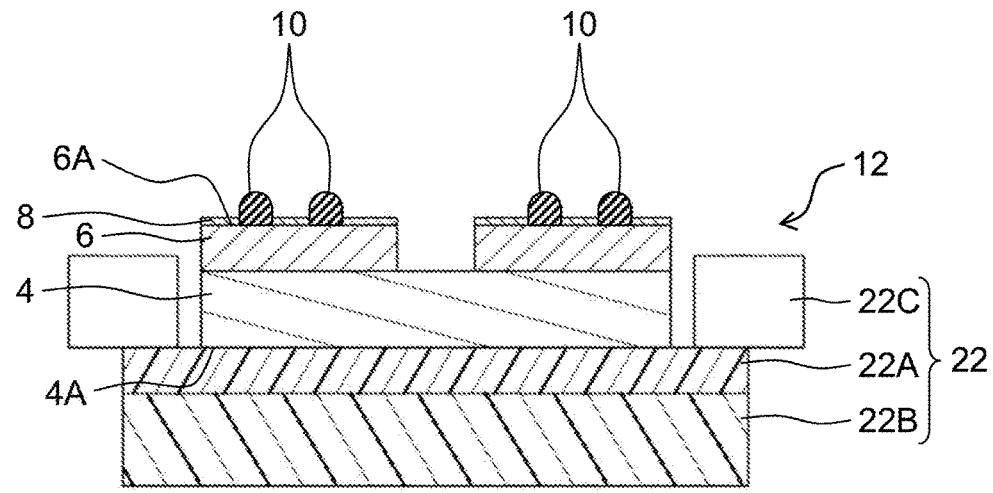
FIG. 4G is a seventh process diagram of the element chip manufacturing method according to the second exemplary embodiment.

In the third process (first exposed portion forming process) illustrated in FIG. 4C, first exposed portion 18A is formed in dividing region 16. The first exposed portion 18A is formed by cutting wiring layer 6 and protective film 8 by using laser scribing, mechanical dicing, or the like. Semiconductor layer 4 is exposed in first exposed portion 18A when seen from a surface 6A side of semiconductor wafer 12. A surface-coating film of resist or the like may be formed and subjected to laser processing together with wiring layer 6 and protective film 8 in order to prevent scattered matter from being attached to semiconductor wafer 12 during laser processing. In this case, although the scattered matter during laser processing is attached to the surface-coating film, it is possible to remove the attached scattered matter by dissolving the surface-coating film by organic cleaning.

Figure 4H:
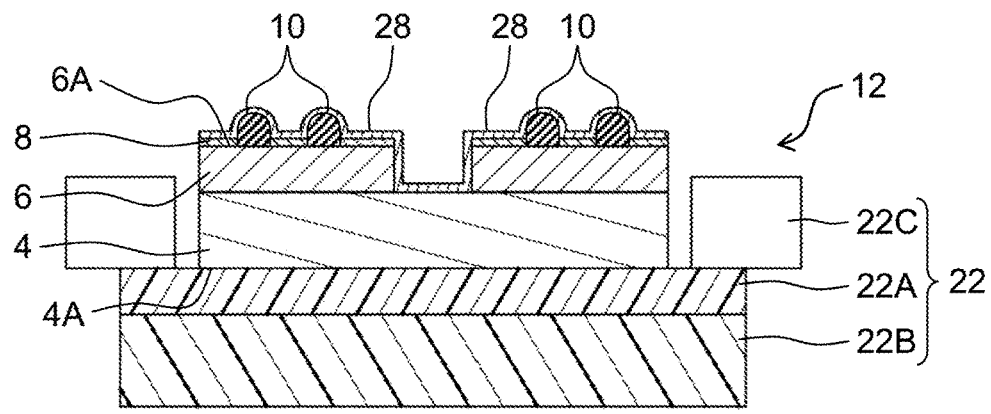
FIG. 4H is an eighth process diagram of the element chip manufacturing method according to the second exemplary embodiment.

The fourth process (protection process), the fifth process (thinning process), the sixth process (first holding process), the seventh process (second holding process), and the eighth process (mask forming process) of the present exemplary embodiment illustrated in FIG. 4D to FIG. 4H are the same as those of the first exemplary embodiment. The eighth process (mask forming process) of the present exemplary embodiment illustrated in FIG. 4H is a mask forming process. As a method for forming mask 28, although the spray coating method is adopted similar to the first exemplary embodiment, an illustration of spray coating apparatus 100 (see FIG. 1G) is omitted.

Figure 4I:
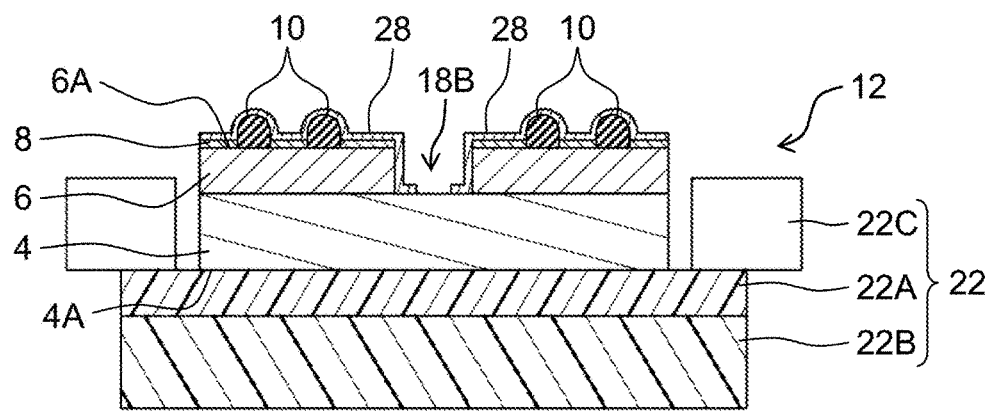
FIG. 4I is a ninth process diagram of the element chip manufacturing method according to the second exemplary embodiment.

In the ninth process (second the exposed portion forming process) of the present exemplary embodiment illustrated in FIG. 4I, second exposed portion 18B is formed in dividing region 16. Second exposed portion 18B is formed by cutting mask 28 which covers first exposed portion 18A by laser processing or the like. Semiconductor layer 4 is exposed in second exposed portion 18B when seen from a surface 6A side of semiconductor wafer 12.

A method which is different from the above-described method and in which exposing and developing are performed on mask 28 and an opening is formed on a portion corresponding to dividing region 16 of mask 28 to form second exposed portion 18B may be adopted.

Figure 4J:
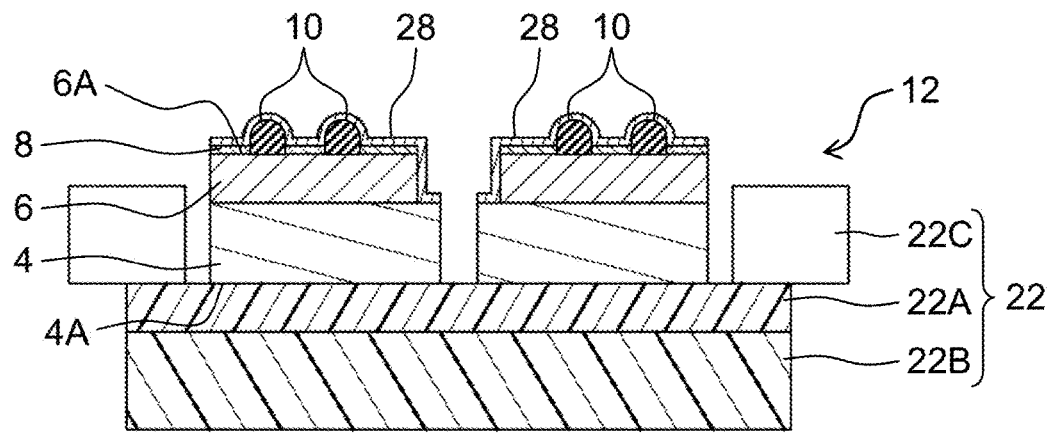
FIG. 4J is a tenth process diagram of the element chip manufacturing method according to the second exemplary embodiment.
Figure 4K:
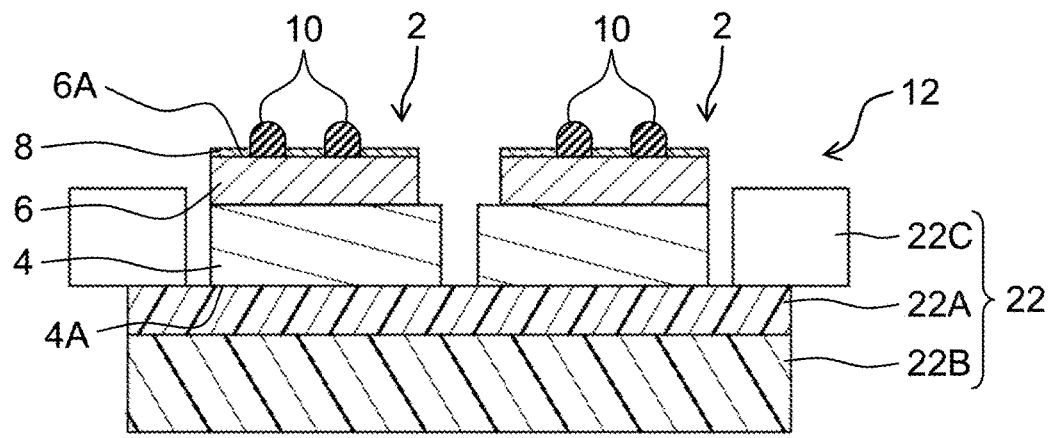
FIG. 4K is an eleventh process diagram of the element chip manufacturing method according to the second exemplary embodiment.

The tenth process (singulation process) and the eleventh process (ashing process) of the present exemplary embodiment illustrated in FIG. 4J and FIG. 4K are the same as those of the first exemplary embodiment.

In a case of the first exemplary embodiment, a situation in which semiconductor layer 4 immediately below wiring layer 6 in the vicinity of the opening of exposed portion 18 is etched slightly in the lateral direction and wiring layer 6 laterally protrudes slightly more than semiconductor layer 4 on the side surface of the semiconductor chip by a difference in etching easiness between semiconductor layer 4 and wiring layer 6 in plasma dicing may occur. When such protrusion is present on the side surface of the semiconductor chip, a failure (delamination) that wiring layer 6 is peeled off from semiconductor layer 4 becomes easy to occur.

In a case of the second exemplary embodiment, since mask 28 is formed to cover surface 6A of semiconductor wafer 12 including first exposed portion 18A in the mask forming process (see FIG. 4H) after forming first exposed portion 18A in the first the exposed portion forming process (see FIG. 4C), it becomes possible to form second exposed portion 18B which is an opening of which the width is narrower than first exposed portion 18A on mask 28 in the second exposed portion forming process (see FIG. 4I). In semiconductor chip 2 formed in this manner, since the end-section of circuit layer 6 is disposed further inside than the end-section of semiconductor layer 4, a phenomenon (delamination) in which circuit layer 6 is peeled off from semiconductor layer 4 or flaking off (chipping) due to contact or the like is hard to occur.

Since circuit layer 6 is severed at dividing region 16 in the first exposed portion forming process (FIG. 4C) before the thinning process (see FIG. 4E), the intrinsic film stresses existent in circuit layer 6 is previously mitigated. Accordingly, in the thinning process (see FIG. 4E), since grinding is performed in a state where warpage of semiconductor wafer 12 is reduced, a crack of semiconductor wafer 12 is hardly generated.

Third Exemplary Embodiment

In a manufacturing method of semiconductor chip 2 of the present exemplary embodiment of which respective processes are illustrated in FIG. 5A to FIG. 5J, the mask forming process to mask bump 10 is provided before the protection process in which BG tape 20 is attached to surface 6A of semiconductor wafer 12, unlike the first exemplary embodiment and the second exemplary embodiment. Except for matters relating to this, it is the same as the manufacturing method of semiconductor chip 2 of the first exemplary embodiment illustrated in FIG. 1A to FIG. 1J. Accordingly, same reference numerals are given to the same portions as those illustrated in FIG. 1A to FIG. 1J and description thereof will be omitted.

Figure 5A:
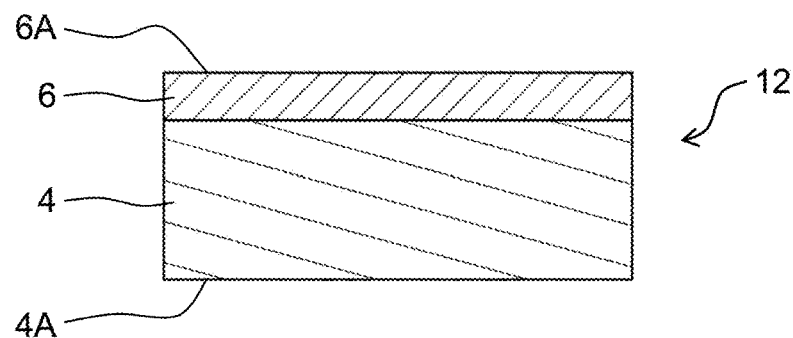
FIG. 5A is a first process diagram of an element chip manufacturing method according to a third exemplary embodiment.
Figure 5B:
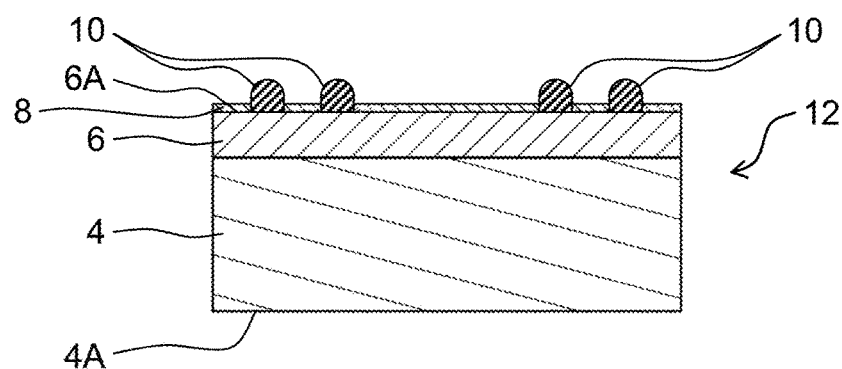
FIG. 5B is a second process diagram of the element chip manufacturing method according to the third exemplary embodiment.
Figure 5C:
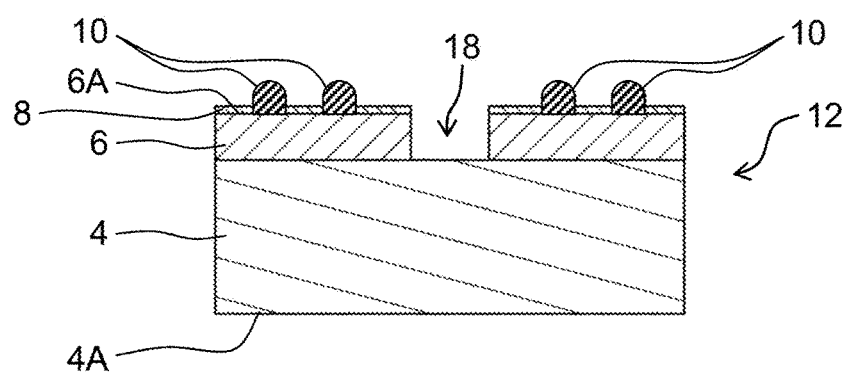
FIG. 5C is a third process diagram of the element chip manufacturing method according to the third exemplary embodiment.

The first process to the third process of the present exemplary embodiment illustrated in FIG. 5A to FIG. 5C are the preparation process, the bump forming process, and the exposed portion forming process in this order and respective processes are the same as those of the first exemplary embodiment.

Figure 5D:
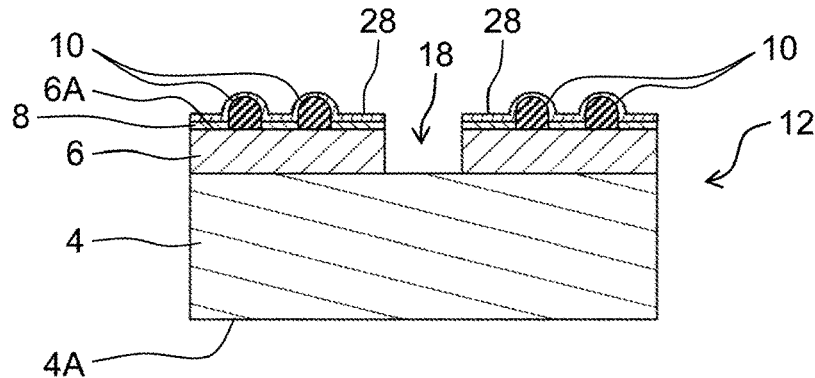
FIG. 5D is a fourth process diagram of the element chip manufacturing method according to the third exemplary embodiment.
Figure 5E:
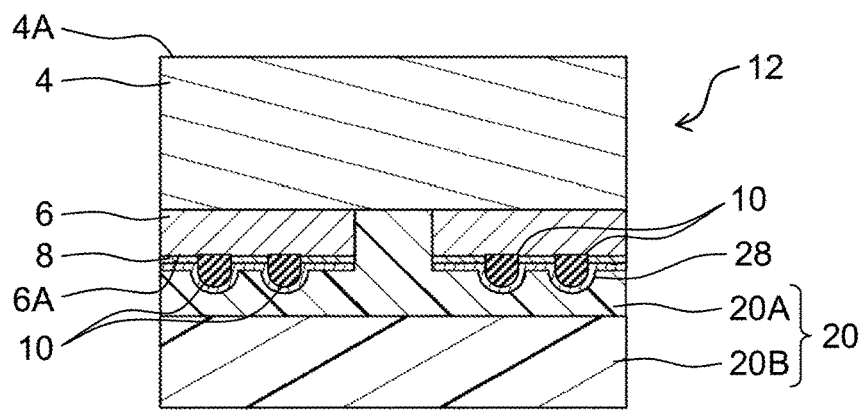
FIG. 5E is a fifth process diagram of the element chip manufacturing method according to the third exemplary embodiment.
Figure 5F:
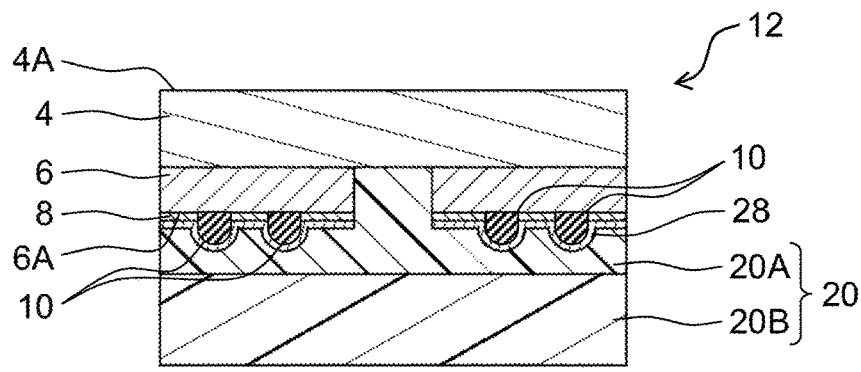
FIG. 5F is a sixth process diagram of the element chip manufacturing method according to the third exemplary embodiment.
Figure 5G:
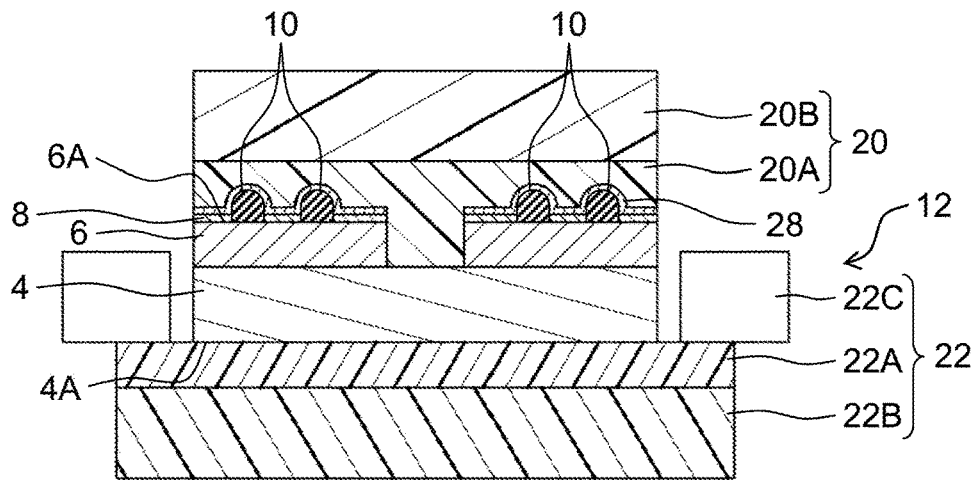
FIG. 5G is a seventh process diagram of the element chip manufacturing method according to the third exemplary embodiment.
Figure 5H:
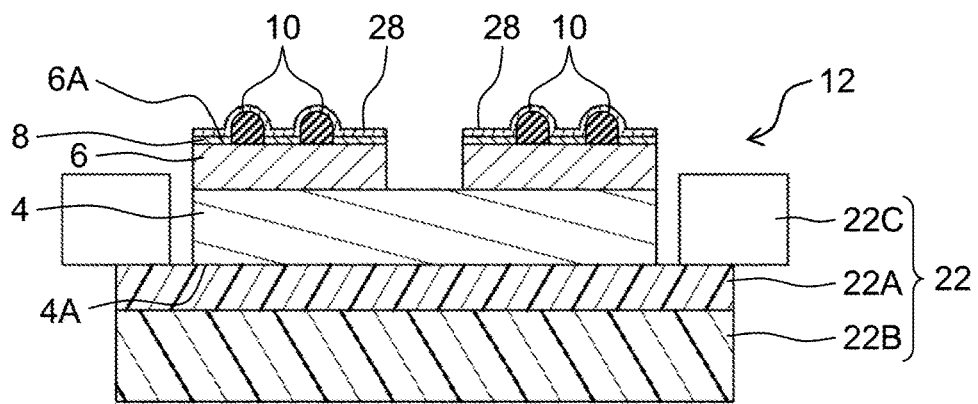
FIG. 5H is an eighth process diagram of the element chip manufacturing method according to the third exemplary embodiment.
Figure 5I:
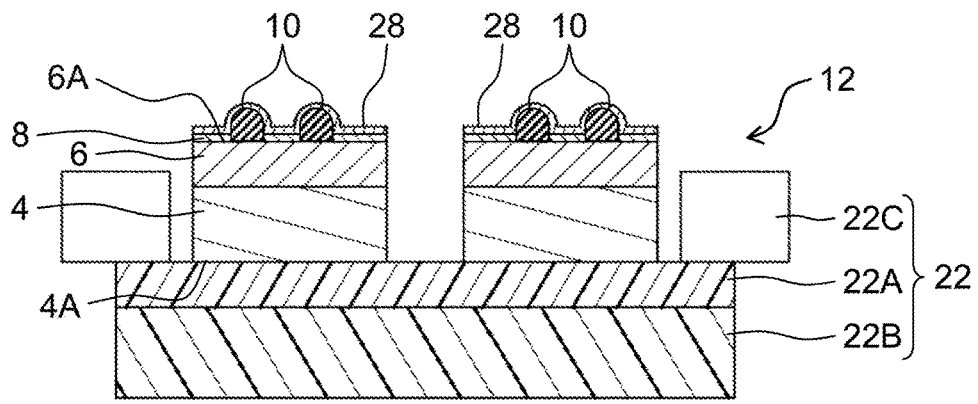
FIG. 5I is a ninth process diagram of the element chip manufacturing method according to the third exemplary embodiment.
Figure 5J:
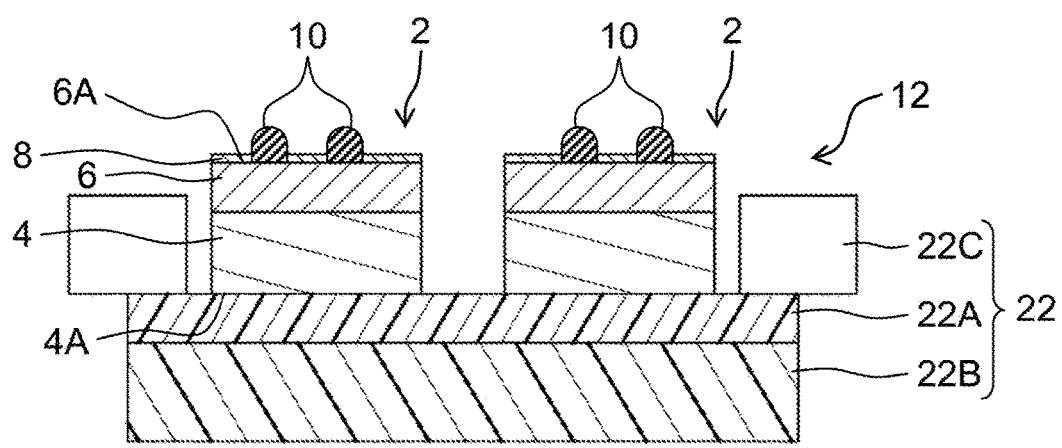
FIG. 5J is a tenth process diagram of the element chip manufacturing method according to the third exemplary embodiment.

The fourth process illustrated in FIG. 5D is the mask forming process. As a method for forming mask 28, although the spray coating method is adopted similar to the first exemplary embodiment, an illustration of spray coating apparatus 100 (see FIG. 1G) is omitted.

The fifth process to the tenth process illustrated in FIG. 5E to FIG. 5J are the protection process, the thinning process, the first holding process, the second holding process, the singulation process, and the ashing process in this order and respective processes are the same as those of the first exemplary embodiment.

According to the present exemplary embodiment, since the fourth process (mask forming process) is performed before the sixth process (thinning process), it becomes possible to form mask 28 in a state where semiconductor wafer 12 is thick and crack of semiconductor wafer 12 is hardly generated during the process of forming the mask.

Fourth Exemplary Embodiment

In a manufacturing method of semiconductor chip 2 of the present exemplary embodiment of which respective processes are illustrated in FIG. 6A to FIG. 6J, the mask forming process is provided before the exposed portion forming process, unlike the first exemplary embodiment. Except for matters relating to this, it is the same as the manufacturing method of semiconductor chip 2 of the first exemplary embodiment illustrated in FIG. 1A to FIG. 1J. Accordingly, same reference numerals are given to the same portions as those illustrated in FIG. 1A to FIG. 1J and description thereof will be omitted.

Figure 6A:
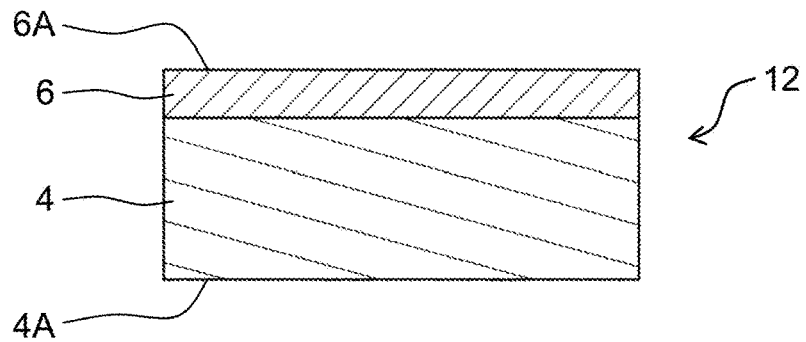
FIG. 6A is a first process diagram of an element chip manufacturing method according to a fourth exemplary embodiment.
Figure 6B:
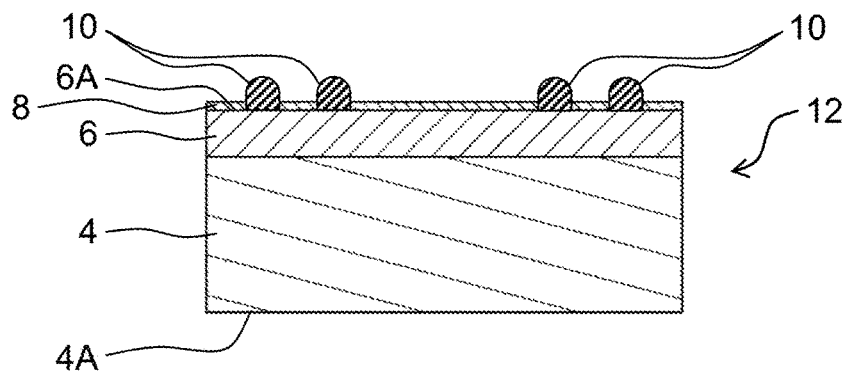
FIG. 6B is a second process diagram of the element chip manufacturing method according to the fourth exemplary embodiment.

The first process and the second process of the present exemplary embodiment illustrated in FIG. 6A and FIG. 6B are the preparation process and the bump forming process, respectively, and respective processes are the same as those of the first exemplary embodiment.

Figure 6C:
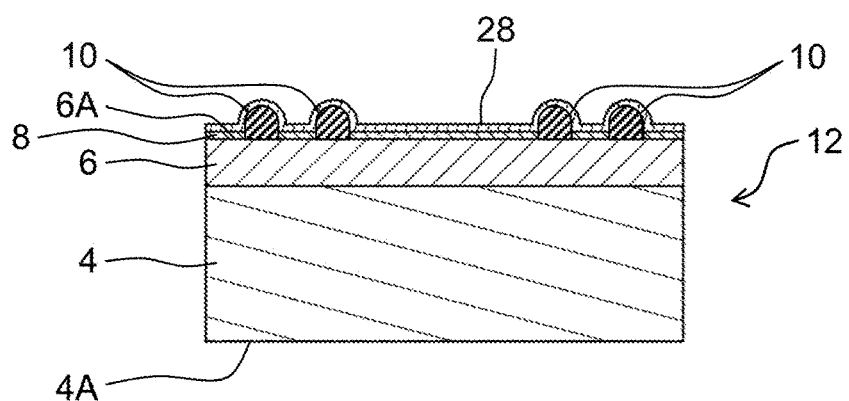
FIG. 6C is a third process diagram of the element chip manufacturing method according to the fourth exemplary embodiment.
Figure 6D:
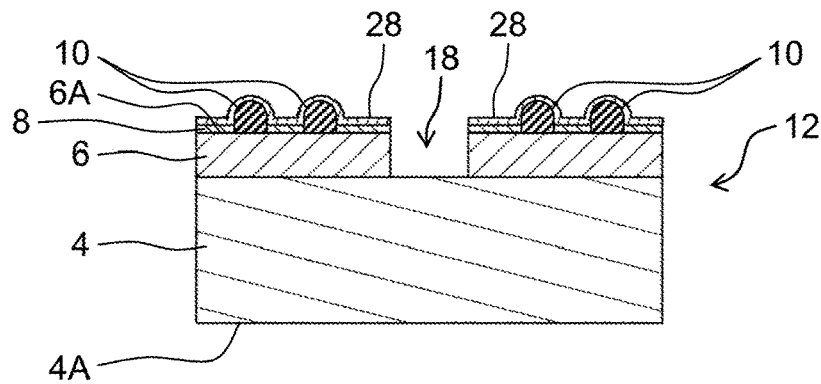
FIG. 6D is a fourth process diagram of the element chip manufacturing method according to the fourth exemplary embodiment.
Figure 6E:
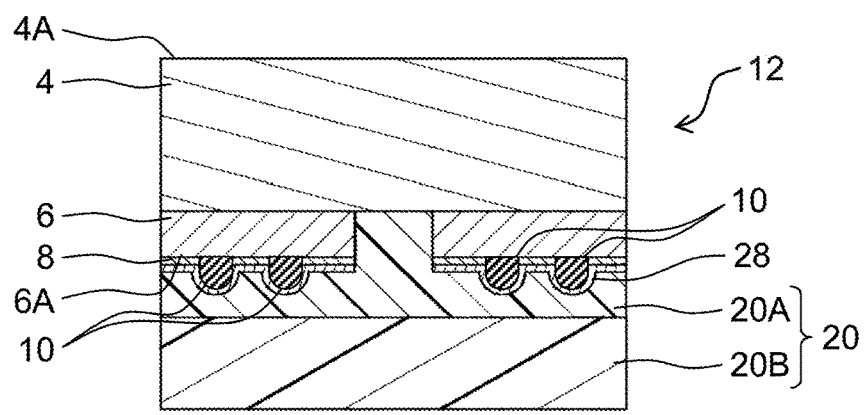
FIG. 6E is a fifth process diagram of the element chip manufacturing method according to the fourth exemplary embodiment.
Figure 6F:
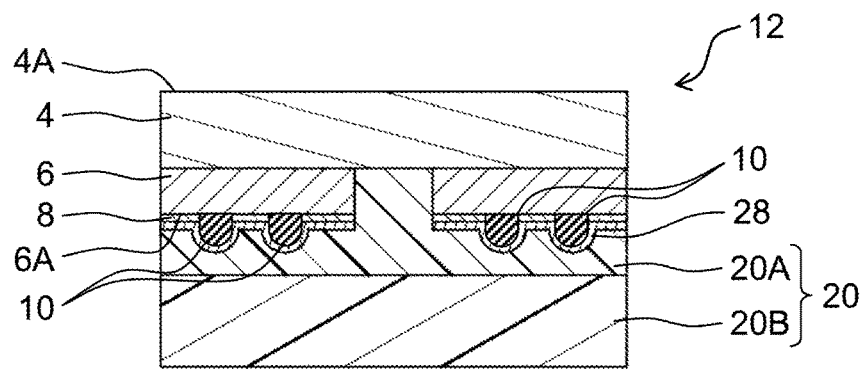
FIG. 6F is a sixth process diagram of the element chip manufacturing method according to the fourth exemplary embodiment.
Figure 6G:
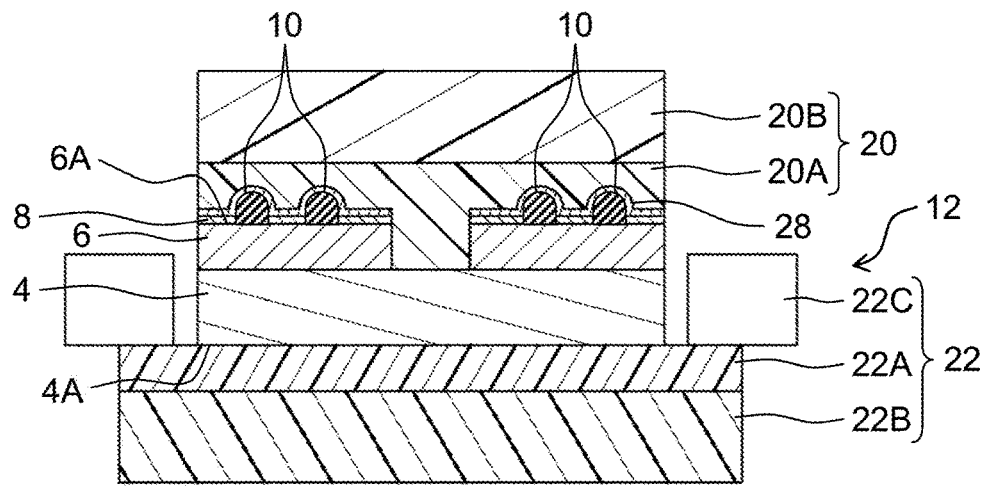
FIG. 6G is a seventh process diagram of the element chip manufacturing method according to the fourth exemplary embodiment.
Figure 6H:
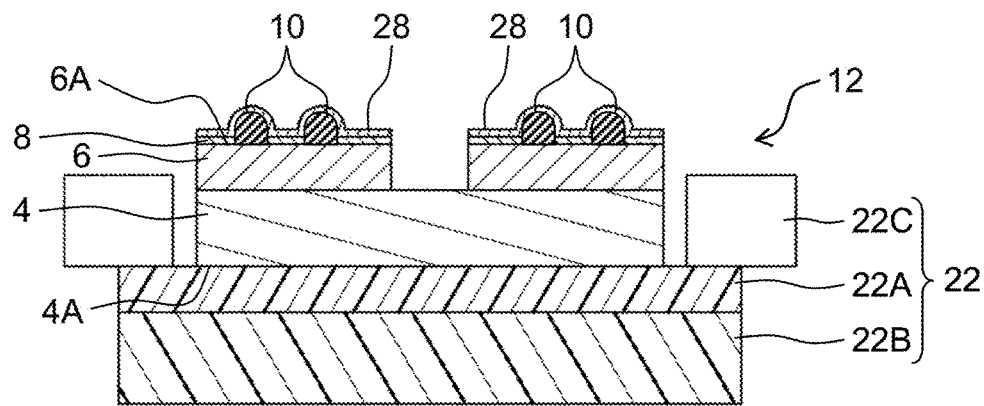
FIG. 6H is an eighth process diagram of the element chip manufacturing method according to the fourth exemplary embodiment.
Figure 6I:
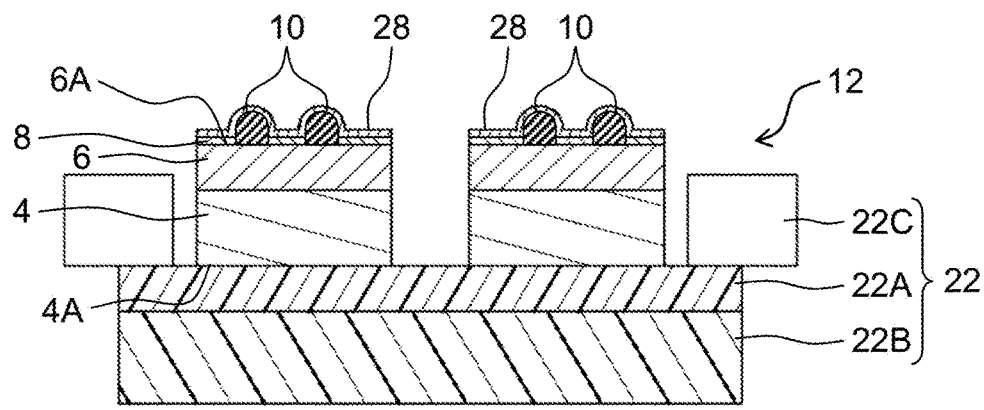
FIG. 6I is a ninth process diagram of the element chip manufacturing method according to the fourth exemplary embodiment.
Figure 6J:
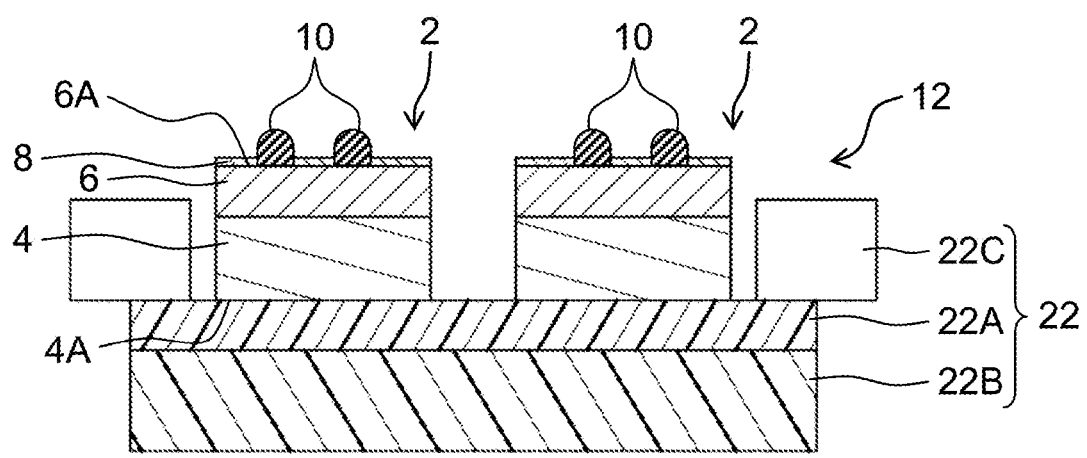
FIG. 6J is a tenth process diagram of the element chip manufacturing method according to the fourth exemplary embodiment.

The third process illustrated in FIG. 6C is the mask forming process. As a method for forming the mask, although the spray coating method is adopted similar to the first exemplary embodiment, an illustration of spray coating apparatus 100 (see FIG. 1G) is omitted.

The fourth process to the tenth process illustrated in FIG. 6D to FIG. 6J are the exposed portion forming process, the protection process, the first holding process, the second holding process, the singulation process, and the ashing process in this order and respective processes are the same as those of the first exemplary embodiment.

According to the method of the present exemplary embodiment, since exposed portion 18 is formed in the fourth process (exposed portion forming process) after mask 28 is formed on bump 10 in the third process (mask forming process), it is possible to form exposed portion 18 in a state where bump 10 is protected from cut pieces generated when exposed portion 18 is formed.

Although specific exemplary embodiments of the present disclosure were described, the present disclosure is not limited to the exemplary embodiments described above and various modifications may be made thereto so as to be embodied within a scope of the present disclosure. For example, a suitable combination of contents of respective exemplary embodiments may be embodied as an exemplary embodiment of the present disclosure. In respective exemplary embodiments, the order of respective processes may be replaced with others in an inconsistent aspect, except as otherwise expressly stated.

CONCLUSION

An element chip manufacturing method of the present disclosure includes preparing a substrate including a first face on which a metal electrode is exposed, a second face located at a side opposite to the first face, a plurality of element regions on each of which the metal electrode is formed, and a dividing region defining each of the element regions, forming a mask which covers the metal electrode along the metal electrode in the first face of the substrate and has an opening exposing the dividing region, and singulating the substrate by exposing the first face of the substrate to first plasma and etching the dividing region, which is exposed to the opening, until the second face is reached in a state where the metal electrode is covered by the mask.

According to this method, since a mask covering a metal electrode along the metal electrode is formed when the mask is formed on a prepared substrate, it is possible to surely cover the entire surface of the metal electrode. For that reason, the metal electrode is surely protected when the substrate is singulated by plasma etching in a post-process, and it is possible to prevent degradation of the metal electrode due to plasma processing.

In the element chip manufacturing method, the forming of the mask may be performed by spraying liquid which contains raw materials of the mask by using a spray coating method.

According to this method, since the spray coating method is adopted for formation of the mask and liquid resist is sprayed by spraying, it is possible to surely cover the surface of the metal electrode following a shape of the metal electrode without being depended on the shape of the metal electrode. For that reason, it is possible to perform plasma processing also on the substrate including metal electrodes of various shapes by the same method and manufacturing efficiency of an element chip is enhanced. Especially, in a case of the metal electrode having a highly protruding shape, since the coating of the head top part of the metal electrode is frequently insufficient in the spin coating method, it is effective to adopt the spray coating method as in the method described above.

The element chip manufacturing method may include holding the second face of the substrate by a holding tape and placing the substrate on a stage through the holding tape after the forming of the mask and the holding of the second face of the substrate by the holding tape and before the singulating of the substrate.

According to this method, even after the substrate is singulated, it is easy to handle the substrate by holding of the holding tape.

The element chip manufacturing method may include, after the singulation of the substrate, exposing the metal electrode by removing the mask by exposing the singulated substrate in a state of being held by the holding tape to second plasma.

According to this method, it is possible to remove the mask which becomes unnecessary and expose the metal electrode to the surface of the element chip.

In the element chip manufacturing method, it is preferable that the substrate includes a first layer which is a semiconductor layer having the second face and a second layer which is a wiring layer formed on the first layer and having the first face on which the metal electrode is formed, and the method further includes, after the forming of the mask, attaching a protection tape to a surface of the substrate through the mask and grinding the first layer are included.

According to this method, since the protection tape is attached to the metal electrode after the mask is formed, it is possible to more surely protect the metal electrode.

What is claimed is:
1. An element chip manufacturing method comprising:
preparing a substrate including a first face and a second face located at a side opposite to the first face;
forming a metal electrode having a height between 20 µm and 200 µm on the first face of the substrate, wherein the substrate includes a plurality of element regions on each of which the metal electrode is formed, and a dividing region defining each of the element regions, and wherein a top surface of the metal electrode is exposed;
forming a mask which covers the first face of the substrate and the exposed top surface of the metal electrode by spraying a liquid containing raw materials of the mask by using a spray coating apparatus, the mask being formed so as to follow a shape of the metal electrode without exposing the metal electrode;
forming an opening in the dividing region by removing the mask covering the dividing region; and
singulating the substrate by exposing the first face of the substrate to first plasma and etching the dividing region until the second face is reached in a state where the metal electrode is covered by the mask.

2. The element chip manufacturing method of claim 1, wherein the liquid is diluted with methyl ethyl ketone or propylene glycol monomethyl ether acetate in forming of the mask by spraying.

3. The element chip manufacturing method of claim 2, wherein the liquid is diluted to a viscosity of approximately 20 cp.

4. The element chip manufacturing method of claim 1, wherein the liquid is sprayed together with a compressed gas.

5. The element chip manufacturing method of claim 1, wherein the spray coating apparatus includes a spray nozzle for spraying the liquid and a stage on which the substrate is placed, and
wherein in forming of the mask by spraying, a discharge rate of the liquid is set to 3 to 15 µl/sec, and a distance between the spray nozzle and the stage is set to 30 to 100 mm.

6. The element chip manufacturing method of claim 5, wherein a temperature of the stage in forming of the mask by spraying is a room temperature.

7. The element chip manufacturing method of claim 1, wherein homogenization of wettability of the first face by processing with hexamethyldisilazane or plasma is performed before spraying the liquid.

8. The element chip manufacturing method of claim 1, wherein the opening is formed by a laser scribing method.

* * * * *